US012412496B2

(12) United States Patent
Kim et al.

(10) Patent No.: US 12,412,496 B2
(45) Date of Patent: Sep. 9, 2025

(54) APPARATUS AND METHOD OF MANUFACTURING A DISPLAY DEVICE

(71) Applicant: Samsung Display Co., Ltd., Yongin-si (KR)

(72) Inventors: Dongwoo Kim, Yongin-si (KR); Jungmin Lee, Yongin-si (KR); Myunggil Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 493 days.

(21) Appl. No.: 17/749,023

(22) Filed: May 19, 2022

(65) Prior Publication Data

US 2022/0384770 A1 Dec. 1, 2022

(30) Foreign Application Priority Data

May 26, 2021 (KR) ........................ 10-2021-0067584

(51) Int. Cl.

| | |
|---|---|
| ***H01L 21/66*** | (2006.01) |
| ***G09G 3/00*** | (2006.01) |
| ***H01L 51/56*** | (2006.01) |
| *H10K 59/122* | (2023.01) |
| *H10K 71/00* | (2023.01) |

(52) U.S. Cl.

CPC ............. *G09G 3/035* (2020.08); *H01L 22/20* (2013.01); *H10K 59/122* (2023.02); *H10K 71/00* (2023.02)

(58) Field of Classification Search

CPC ...... H10K 71/00; H10K 59/122; H10K 71/50; H01L 22/20

See application file for complete search history.

(56) References Cited

U.S. PATENT DOCUMENTS

| | | | | |
|---|---|---|---|---|
| 10,165,715 | B2 | 12/2018 | Choi et al. | |
| 2012/0024475 | A1 | 2/2012 | Kitajima et al. | |
| 2012/0286312 | A1* | 11/2012 | Hatano ................ | H10K 71/421 257/E33.061 |

(Continued)

FOREIGN PATENT DOCUMENTS

| | | |
|---|---|---|
| KR | 10-0860421 | 9/2008 |
| KR | 10-2012-0022569 | 3/2012 |

(Continued)

*Primary Examiner* — Walter H Swanson

(74) *Attorney, Agent, or Firm* — CANTOR COLBURN LLP

(57) ABSTRACT

An apparatus for manufacturing a display device includes a stage to support first and second members, and a pressurization portion spaced apart from the stage and to press the first or second member. The pressurization portion includes: a contact portion facing the stage and to contact the first or second member; a first force application unit connected to the contact portion and to linearly move the contact portion; and a second force application unit connected to the contact portion and spaced apart from the first force application unit. The second force application unit linearly moves the contact portion in a portion of the contact portion that is different from the portion contacted by the first force application unit. At least one of the first and second force application units is configured to operate according to a force applied by the contact portion to one of the first and second members.

10 Claims, 13 Drawing Sheets

172b-3
172a
172b-1
172c-3
172a-1
172c-1
171
FM2
AH
FM1
141
140
Z
X
Y

(56) References Cited

U.S. PATENT DOCUMENTS

| | | | | |
|---|---|---|---|---|
| 2016/0254455 | A1* | 9/2016 | Wang | H10K 50/818 438/23 |
| 2017/0257988 | A1* | 9/2017 | Choi | H05K 13/00 |
| 2020/0348335 | A1 | 11/2020 | Park et al. | |

FOREIGN PATENT DOCUMENTS

| | | |
|---|---|---|
| KR | 10-2013-0103971 | 9/2013 |
| KR | 10-2013-0109648 | 10/2013 |
| KR | 10-1519329 | 5/2015 |
| KR | 10-2017-0064619 | 6/2017 |
| KR | 10-2017-0104102 | 9/2017 |
| KR | 10-2142881 | 8/2020 |
| KR | 10-2021-0056588 | 5/2021 |

* cited by examiner

APPARATUS AND METHOD OF MANUFACTURING A DISPLAY DEVICE

CROSS-REFERENCE TO RELATED APPLICATION

This application claims priority to and the benefit of Korean Patent Application No. 10-2021-0067584, filed May 26, 2021, which is hereby incorporated by reference for all purposes as if fully set forth herein.

BACKGROUND

Field

One or more embodiments generally relate to apparatuses and methods, and more particularly, to apparatuses and methods of manufacturing a display device.

Discussion

Electronic devices based on mobility are widely used. In addition to small electronic devices, such as mobile phones, tablet personal computers (PCs) have recently been widely used as mobile electronic devices. Such a mobile electronic device typically includes a display device to support various functions and provide visual information, such as an image or video, to a user. As other components for driving a display device have been miniaturized, the proportion occupied by a display device in electronic devices is gradually increasing, and a structure that is bendable to have a predetermined angle from a flat state is growing in interest.

A film member may be attached to such a display device to protect a display panel or add various functions and the like. Furthermore, when the display panel is bent, a display circuit board may be fixed to the display panel. In this state, it is a very important issue to attach the film member by applying uniform pressure. When a member is attached, if a pressure is not applied uniformly, the member may be damaged or may not be attached quickly and uniformly.

The above information disclosed in this section is only for understanding the background of the inventive concepts, and, therefore, may contain information that does not form prior art.

SUMMARY

One or more embodiments provide apparatuses and methods of manufacturing a display device, by which a first member and a second member may be uniformly attached on an entire surface.

Additional aspects will be set forth in the detailed description which follows, and, in part, will be apparent from the disclosure, or may be learned by practice of the inventive concepts.

According to an embodiment, an apparatus for manufacturing a display device includes a stage and a pressurization portion. The stage is configured to support a first member and a second member. The pressurization portion is spaced apart from the stage and configured to press the first member or the second member. The pressurization portion includes a contact portion, a first force application unit, and a second force application unit. The contact portion faces the stage and is configured to contact the first member or the second member. The first force application unit is connected to the contact portion and is configured to linearly move the contact portion. The second force application unit is connected to the contact portion and is spaced apart from the first force application unit. The second force application unit is configured to linearly move the contact portion in a portion of the contact portion that is different from the portion contacted by the first force application unit. At least one of the first force application unit and the second force application unit is configured to operate according to a force applied by the contact portion to one of the first member and the second member.

According to an embodiment, a method of manufacturing a display device includes arranging a first member and a second member on a stage; pressing one of the first member and the second member at at least two positions on one surface of one of the first member and the second member; measuring forces applied to the at least two positions on the one surface of the one of the first member and the second member; and adjusting at least one of the forces applied to the at least two positions on the one surface of the one of the first member and the second member to be within a range of a predetermined force based on the forces applied to the at least two positions on the one surface of the one of the first member and the second member.

According to an embodiment, a method of manufacturing a display device includes: arranging a first member and a second member on a stage; pressing one of the first member and the second member at at least two positions on one surface of one of the first member and the second member; and adjusting forces applied to the at least two positions on the one surface of the one surface of the one of the first member and the second member to be the same based on forces applied to the one of the first member and the second member.

One or more embodiments may be embodied using a system, a method, a computer program, or any combination of a system, a method, and a computer program.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings.

DETAILED DESCRIPTION

Figure 1:
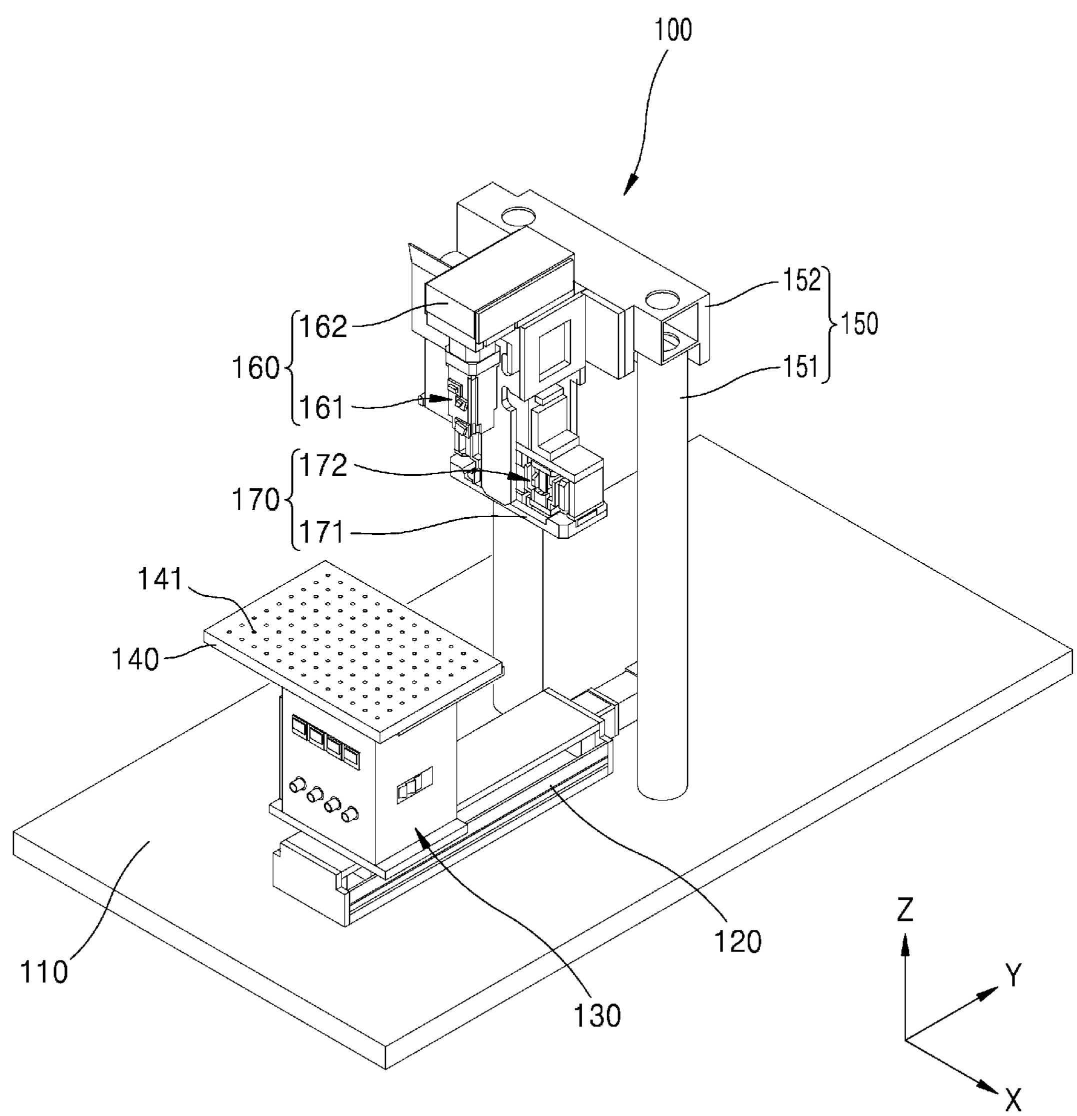
FIG. 1 is a perspective view of an apparatus for manufacturing a display device according to an embodiment.

In the following description, for the purposes of explanation, numerous specific details are set forth in order to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

Figure 2:
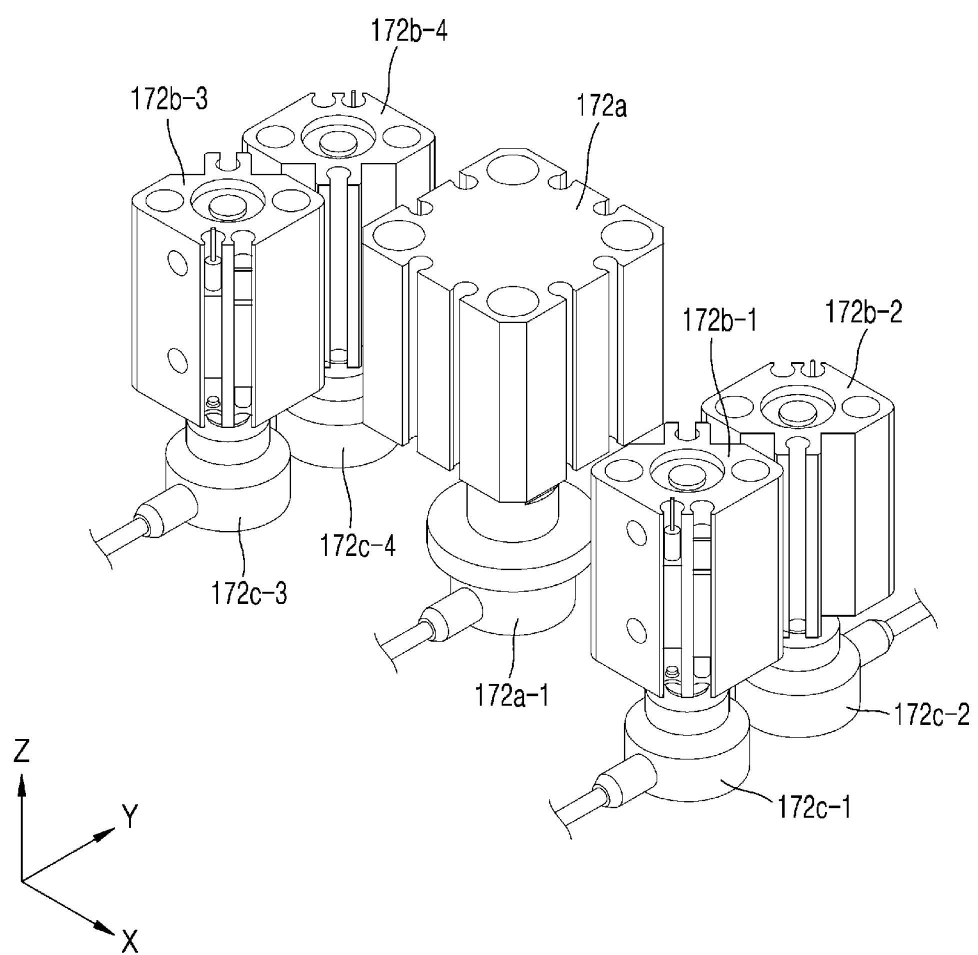
FIG. 2 is a perspective view of a linear driving portion and a detection unit of FIG. 1 according to an embodiment.

FIG. 1 is a perspective view of an apparatus 100 for manufacturing a display device according to an embodiment. FIG. 2 is a perspective view of a linear driving portion and a detection unit of FIG. 1 according to an embodiment.

Referring to FIGS. 1 and 2, the apparatus 100 for manufacturing a display device may include a base portion 110, a stage driving portion 120, a movement portion 130, a stage 140, a pressurization portion 170, a support portion 150, and a position adjustment portion 160.

The base portion 110 may be arranged on a structure, such as an external building, machine tool, and/or the like. In this state, the base portion 110 may be in the form of a plate, or a form in which a plurality of frames is combined with each other in a lattice form.

The stage driving portion 120 may be arranged on the base portion 110 and may linearly move the movement portion 130 and the stage 140 in a first direction, for example, a Y-axis direction of FIG. 1. The stage driving portion 120 may have various shapes. In an embodiment, the stage driving portion 120 may include a linear motor to linearly move the movement portion 130 placed on the stage driving portion 120. In another embodiment, the stage driving portion 120 may include a cylinder connected to the movement portion 130 and a linear guide guiding the movement portion 130 placed on the linear guide to linearly move. In another embodiment, the stage driving portion 120 may include a ball screw connected to the movement portion 130 and a motor connected to the ball screw. In this state, the stage driving portion 120 is not limited thereto, and may include all apparatuses and structures arranged on the base portion 110 to linearly move the movement portion 130.

The movement portion 130 may be placed on the stage driving portion 120 and may perform a linear motion in the length direction of the stage driving portion 120, for example, the Y-axis direction of FIG. 1. In this state, various apparatuses may be arranged in the movement portion 130. For example, a pump and/or the like that communicates with a suction hole 141 formed in the stage 140 may be arranged in the movement portion 130. Furthermore, various cables and/or the like may be arranged in the movement portion 130.

The stage 140 may be placed on the movement portion 130 and may move together during the movement of the movement portion 130. In this state, the stage 140 may be formed in the form of a plate and may have a flow path therein. The flow path may be connected to the pump arranged inside or outside the movement portion 130. Furthermore, the flow path may be connected to the suction hole 141 arranged on the upper surface of the stage 140. The suction hole 141 may include a plurality of suction holes that are provided in the upper surface of the stage 140 apart from each other. In this state, the suction holes 141 may be arranged apart from each other at regular intervals.

The pressurization portion 170 may be arranged apart from the stage 140. In this state, the pressurization portion 170 may press a member placed on the stage 140. The pressurization portion 170 may include a plurality of force application units and a plurality of detection units. In this state, each of the detection units may be arranged to correspond to each of the force application units.

The force application units may have various shapes. For example, each of the force application units may include a pneumatic and/or hydraulic cylinder. In another embodiment, each of the force application units may include a servo motor.

The detection units may have various shapes. For example, each of the detection units may include a pressure sensor that measures an applied pressure. In another embodiment, each of the detection units may include a load cell. In another embodiment, each of the detection units may include an electronic pressure sensitive paper. In the following description, for convenience of explanation, a case in which each of the detection units is a load cell is mainly described in more detail.

The force application units may include a first force application unit **172*a* and a second force application unit. In this state, the second force application unit may include a second-1 force application unit 172***b*-1, a second-2 force application unit 172*b*-2, a second-3 force application unit 172*b*-3, and a second-4 force application unit 172*b*-4, which are arranged apart from each other with respect to the first force application unit 172*a*. In this case, the second-1 force application unit 172*b*-1 and the second-2 force application unit 172*b*-2 may be arranged symmetrically with respect to the first force application unit 172*a*. Furthermore, the second-1 force application unit 172*b*-1 and the second-3 force application unit 172*b*-3 may be arranged symmetrically with respect to the first force application unit 172*a*, and the second-2 force application unit 172*b*-2 and the second-4 force application unit 172*b*-4 may be arranged symmetrically with respect to the first force application unit 172*a*. The second-1 force application unit 172*b*-1 and the second-4 force application unit 172*b*-4, and the second-2 force application unit 172*b*-2 and the second-3 force application unit 172*b*-3, may be arranged symmetrically with respect to the first force application unit 172*a*. In this case, the first force application unit 172*a* may be arranged at the center of the pressurization portion 170.

The number of second force application units is not limited to the above description. For example, the second force application unit may include two second force application units, which are arranged symmetrically with respect to the first force application unit 172*a*. In this state, the two second force application units and the first force application unit 172*a* may be arranged in a row, and may be arranged on a straight line passing the center of the pressurization portion 170. The second force application unit described as above may include even-numbered second force application units. In the following description, for convenience of explanation, a case in which the second force application unit includes four second force application units is described in more detail.

The detection units may include a first detection unit 172*a*-1 connected to the first force application unit 172*a* and a second detection unit connected to the second force application unit. In this state, the number of second detection units is the same as the number of second force application units, and the second detection units may be arranged corresponding to the positions of the second force application units.

In the above case, the second detection units may include a second-1 detection unit 172*c*-1 arranged corresponding to the second-1 force application unit 172*b*-1, a second-2 detection unit 172*c*-2 arranged corresponding to the second-2 force application unit 172*b*-2, a second-3 detection unit 172*c*-3 arranged corresponding to the second-3 force application unit 172*b*-3, and a second-4 detection unit 172*c*-4 arranged corresponding to the second-4 force application unit 172*b*-4. In this case, each detection unit may measure a force or pressure applied by each of the force application units.

The support portion 150 may be connected to the pressurization portion 170 to support the pressurization portion 170. In this state, the support portion 150 may include a first support portion 151 connected to the base portion 110 and a second support portion 152 connected to the first support portion 151. As the first support portion 151 and the second support portion 152 are connected to each other in different directions, the pressurization portion 170 may be arranged over the stage 140.

The position adjustment portion 160 may connect the pressurization portion 170 to the support portion 150, and may linearly move the pressurization portion 170 in a third direction, e.g., a Z-axis direction of FIG. 1. In this state, the position adjustment portion 160 may include a position adjustment driving portion 161 and a guide portion 162. In this case, the position adjustment driving portion 161 may have a shape similar to the stage driving portion 120 previously described. Furthermore, the guide portion 162 may be connected to the pressurization portion 170 to guide the movement of the pressurization portion 170 during the movement of the pressurization portion 170. For example, the position adjustment driving portion 161 may include a linear motor, and the guide portion 162 may include a linear motion guide. In another embodiment, the guide portion 162 may include a ball screw, and the position adjustment driving portion 161 may include a motor. In another embodiment, the guide portion 162 may include a rack gear, and the position adjustment driving portion 161 may include a spur gear and a motor.

In some embodiments, the apparatus 100 for manufacturing a display device may separately include a control unit that controls the stage driving portion 120, the stage 140, the position adjustment portion 160, and the pressurization portion 170. In this state, the control unit may be connected to the stage driving portion 120, the stage 140, the position adjustment portion 160, and the pressurization portion 170, in a wired or wireless manner, to control the stage driving portion 120, the stage 140, the position adjustment portion 160, and the pressurization portion 170.

The control unit may have various shapes. For example, the control unit may include a circuit board, a personal computer, a mobile phone, and/or the like. In this state, the control unit is not limited to the above, and may include all apparatuses and structures capable of controlling the stage driving portion 120, the stage 140, the position adjustment portion 160, and the pressurization portion 170 in response to externally input signals.

In the following description, the operation of the apparatus 100 for manufacturing a display device will be described in more detail below.

Figure 3A:
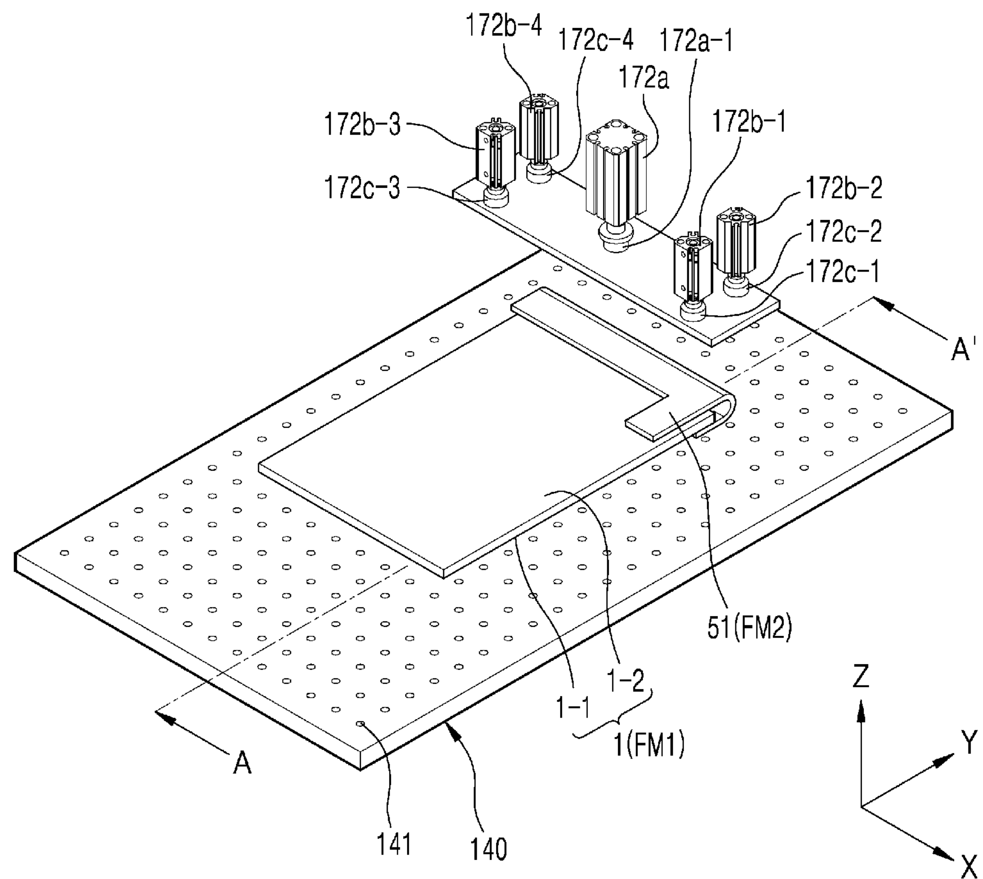
FIG. 3A is a perspective view showing an operation of the apparatus for manufacturing a display device of FIG. 1 according to an embodiment.
Figure 3B:
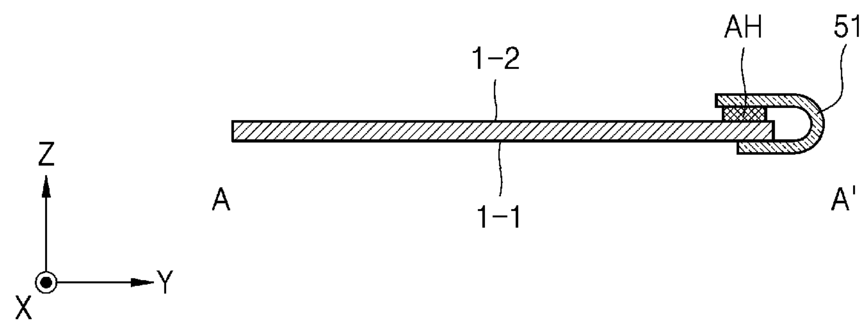
FIG. 3B is a cross-sectional view of a display panel and a display circuit board taken along sectional line A-A' of FIG. 3A according to an embodiment.

FIG. 3A is a perspective view showing an operation of the apparatus 100 for manufacturing a display device of FIG. 1 according to an embodiment. FIG. 3B is a cross-sectional view of a display panel 1 and a display circuit board 51 taken along sectional line A-A' of FIG. 3A according to an embodiment.

Referring to FIGS. 3A and 3B, after a first member FM1 and a second member FM2 are arranged on the stage 140, the first member FM1 and the second member FM2 may be attached to each other via the pressurization portion 170. In this state, when the first member FM1 and the second member FM2 are arranged on the stage 140, the pressurization portion 170 may be disposed correspond to the position(s) of the first member FM1 and the second member FM2.

The first member FM1 may be a display panel 1, and the second member FM2 may be the display circuit board 51. The display panel 1 and the display circuit board 51 may be in a state in which a part of the display circuit board 51 is bent, and the bent part of the display circuit board 51 is temporarily attached to a second surface 1-2 of the display panel 1 by an adhesive member AH. In this case, a first surface 1-1 of the display panel 1 may be a surface where a display area to be described below is arranged to implement an image, and the second surface 1-2 of the display panel 1 may be a surface where the display area is not present. In another embodiment, the first member FM1 may be the display panel 1, and the second member FM2 may include a functional film such as a protection film, a polarized film, and the like. In another embodiment, the first member FM1 may be one part of a substrate of the display panel 1, and the second member FM2 may be another part of the substrate of the display panel 1. However, in the following description, for convenience of explanation, a case in which the first member FM1 is the display panel 1 and the second member FM2 is the display circuit board 51 is described.

In the above case, the display circuit board 51 may be bent before or after being placed on the stage 140. For instance, after an adhesive member AH is arranged on the second surface 1-2 of the display panel 1, one surface of the display circuit board 51 may be attached to the adhesive member AH and the display circuit board 51 may be bent.

In the above case, the display panel 1 may be fixed in a state in which a gas is sucked through the suction hole 141 of the stage 140. In this state, the gas is sucked only in the suction hole 141 where the display panel 1 is arranged, and the gas is not sucked in the other portion.

Figure 3C:
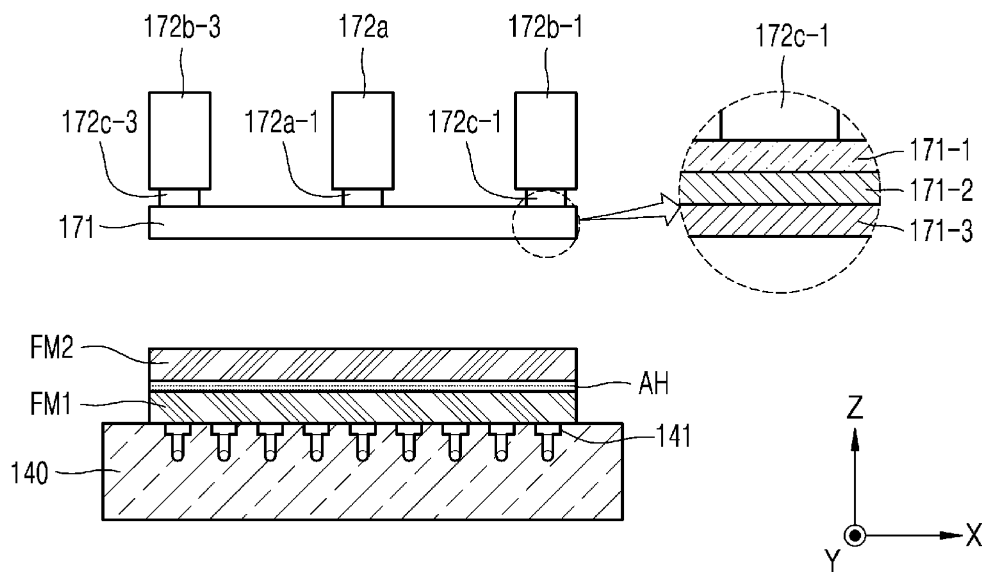
FIG. 3C is a cross-sectional view showing an operation of the apparatus for manufacturing a display device of FIG. 1 according to an embodiment.

FIG. 3C is a cross-sectional view showing an operation of the apparatus 100 for manufacturing a display device of FIG. 1 according to an embodiment.

Referring to FIG. 3C, after the first member FM1, the second member FM2, and the adhesive member AH are arranged on the stage 140 as described above, the first member FM1 or the second member FM2 may be pressed using the pressurization portion 170. In this state, the pressurization portion 170 may include a contact portion 171 connected to the first force application unit 172*a* and the second force application unit, and the contact portion 171 may come in contact with the first member FM1 or the second member FM2. In the following description, a case in which the second member FM2 is arranged above the first member FM1 is described.

The contact portion 171 may include a first body member 171-1, a second body member 171-2, and an elastic member 171-3, which are stacked on each other. The first body member 171-1 and the second body member 171-2 each may include metal, and the elastic member 171-3 may include an elastic material, such as at least one of silicon, rubber, synthetic resin, and the like. In this case, the elastic modulus of the first body member 171-1 may be greater than that of the second body member 171-2. Furthermore, the first body member 171-1 may be connected to the first force application unit 172*a*, the second-1 force application unit 172*b*-1, the second-2 force application unit 172*b*-2, the second-3 force application unit 172*b*-3, and the second-4 force application unit 172*b*-4, respectively, via the first detection unit 172*a*-1, the second-1 detection unit 172*c*-1, the second-2 detection unit 172*c*-2, the second-3 detection unit 172*c*-3, and the second-4 detection unit 172*c*-4.

In the above case, when the first force application unit 172*a*, the second-1 force application unit 172*b*-1, the second-2 force application unit 172*b*-2, the second-3 force application unit 172*b*-3, and the second-4 force application unit 172*b*-4 are operated, the contact portion 171 may descend to contact the second member FM2.

Figure 3D:
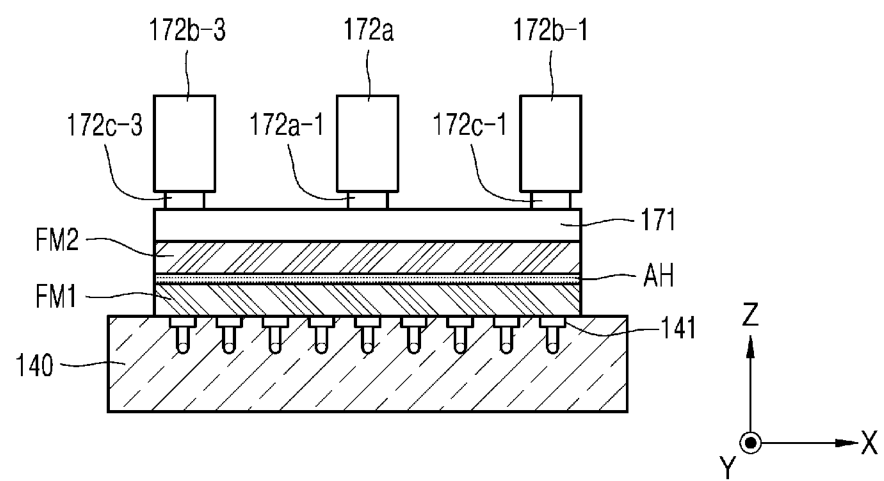
FIG. 3D is a cross-sectional view showing the operation of the apparatus for manufacturing a display device of FIG. 1.

FIG. 3D is a cross-sectional view for showing an operation of the apparatus for manufacturing a display device of FIG. 1 according to an embodiment.

Referring to FIG. 3D, when the first force application unit 172*a*, the second-1 force application unit 172*b*-1, the second-2 force application unit 172*b*-2, the second-3 force application unit 172*b*-3, and the second-4 force application unit 172*b*-4 are continuously operated to continuously descend the contact portion 171, the contact portion 171 may press the second member FM2 to attach the first member FM1 and the second member FM2 with the adhesive member AH. In this case, the first force application unit 172*a*, the second-1 force application unit 172*b*-1, the second-2 force application unit 172*b*-2, the second-3 force application unit 172*b*-3, and the second-4 force application unit 172*b*-4 may press the second member FM2 in response to a preset signal via the contact portion 171. The preset signal may be separately input by a user from the outside or an operation of each of the force application units set according to a manufacturing process. For example, the preset signal may be a force that is to be finally reached when each of the force application units presses the second member FM2 through the contact portion 171.

When each of the force application units is operated as described above, the first detection unit 172*a*-1, the second-1 detection unit 172*c*-1, the second-2 detection unit 172*c*-2, the second-3 detection unit 172*c*-3, and the second-4 detection unit 172*c*-4 may respectively measure forces applied to the first force application unit 172*a*, the second-1 force application unit 172*b*-1, the second-2 force application unit 172*b*-2, the second-3 force application unit 172*b*-3, and the second-4 force application unit 172*b*-4.

The force measured by each detection unit may be compared with a preset force or a force detected by one of the detection units.

In more detail, in another embodiment, when the force measured by each detection unit is compared with a preset force, whether the force measured by the detection unit is the same as or within a range based on the preset force may be determined. For example, it may be determined whether the force detected by the first detection unit 172*a*-1 is the same as or within a range based on the preset force.

When the force detected by the first detection unit 172*a*-1 is the same as or within a range based on the preset force, the first force application unit 172*a* may maintain the state. For example, in another embodiment, when the first force application unit 172*a* is a cylinder, a pressure supplied to the cylinder may be maintained in the current state. In another embodiment, when the first force application unit 172*a* is a servo motor, a currently applied torque may be maintained unchanged.

In contrast, when the force detected by the first detection unit 172*a*-1 is not the same as or is out of the range based on the preset force, the operation of the first force application unit 172*a* may be adjusted. For example, in another embodiment, when the first force application unit 172*a* is a cylinder, a pressure supplied to the cylinder may be adjusted to be more or less than that in the current state. In another embodiment, when the first force application unit 172*a* is a servo motor, torque of the servo motor may be increased to be more or decreased to be less than the current torque of the servo motor.

In another embodiment, when the rest of the force application units are controlled with respect to one force application unit thereof, a force applied to one force application unit may be compared with a force applied to each of the rest of the force application units. For example, when the first force application unit 172*a* applies a force to the contact portion 171, the force detected by the first detection unit 172*a*-1 may be used as a reference. In this state, it may be determined whether the forces detected by the second-1 detection unit 172*c*-1, the second-2 detection unit 172*c*-2, the second-3 detection unit 172*c*-3, and the second-4 detection unit 172*c*-4 are the same as or within a range based on the force detected by the first detection unit 172*a*-1. Then, at least one of the second-1 force application unit 172*b*-1, the second-2 force application unit 172*b*-2, the second-3 force application unit 172*b*-3, and the second-4 force application unit 172_b_-4 may be controlled such that the forces detected by the second-1 detection unit 172_c_-1, the second-2 detection unit 172_c_-2, the second-3 detection unit 172_c_-3, and the second-4 detection unit 172_c_-4 are the same as or within a range based on the force detected by the first detection unit 172_a_-1. In this state, as a method of controlling each of the force application units is similar to the above description, a detailed description thereof is omitted.

The above operation may be continuously repeated while the second member FM2 is pressed by the pressurization portion 170. In more detail, in the above case, by individually controlling a plurality of force application units, the force applied by the contact portion 171 to the second member FM2 may be maintained as evenly as possible in the entire surface of the contact portion 171. Furthermore, even when the level of the contact portion 171 or the stage 140 is not maintained, a uniform force may be applied to the entire surface of the second member FM2 through the above operation.

Thus, the apparatus 100 for manufacturing a display device and the method of manufacturing a display device may uniformly attach the first member FM1 and the second member FM2.

Figure 4A:
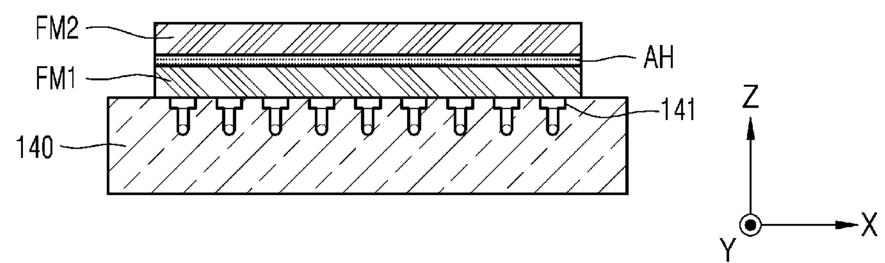
FIG. 4A is a cross-sectional view showing an operation of an apparatus for manufacturing a display device according to an embodiment.
Figure 4B:
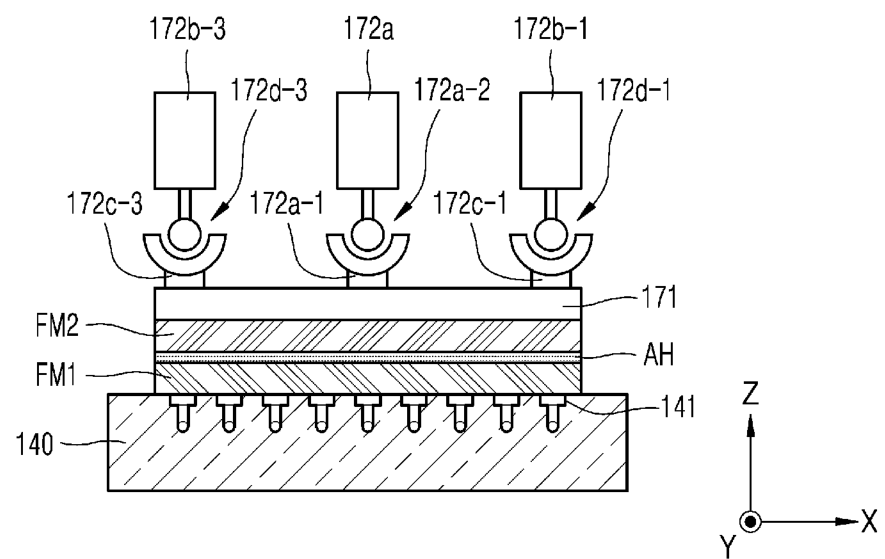
FIG. 4B is a cross-sectional view showing an operation of an apparatus for manufacturing a display device according to an embodiment.

FIG. 4A is a cross-sectional view for showing an operation of an apparatus for manufacturing a display device according to an embodiment. FIG. 4B is a cross-sectional view for showing the operation of an apparatus for manufacturing a display device according to an embodiment.

Referring to FIGS. 4A and 4B, the pressurization portion 170 may include a ball joint arranged between each force application unit and each detection unit.

For example, a first ball joint 172_a_-2 may be arranged between the first force application unit 172_a_ and the first detection unit 172_a_-1. In this state, the first force application unit 172_a_ may have a cylinder shape, the first ball joint 172_a_-2 may be arranged at a tip end of a cylinder, and the first ball joint 172_a_-2 and the contact portion 171 may be connected to each other via the first detection unit 172_a_-1.

A second-1 ball joint 172_d_-1 may be arranged between the second-1 force application unit 172_b_-1 and the second-1 detection unit 172_c_-1, and a second-3 ball joint 172_d_-3 may be arranged between the second-3 force application unit 172_b_-3 and the second-3 detection unit 172_c_-3. In this state, a second-2 ball joint may be arranged between a second-2 force application unit and a second-2 detection unit, and a second-4 ball joint may be arranged between a second-4 force application unit and a second-4 detection unit.

The pressurization portion 170 may be operated in a similar manner to as described in association with FIGS. 3A to 3D. In this case, each ball joint connects each of the force application units to the contact portion 171 with a certain degree of allowance, and thus, even when the contact portion 171 tilts or the stage 140 is out of balance, the lower surface of the contact portion 171 may be in close contact with the upper surface of the second member FM2.

Furthermore, as each ball joint transfers a force according to the operation of each of the force application units to the contact portion 171 through a point contact between a ball structure and a housing in which the ball structure is accommodated, regardless of the arrangement of the force application units, the force may be transferred in a direction perpendicular to the upper surface or lower surface of the contact portion 171.

Figure 5A:
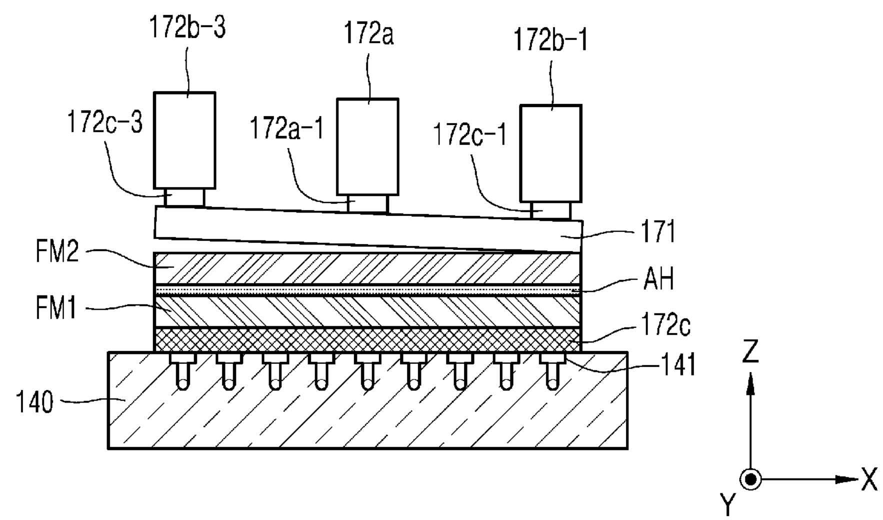
FIG. 5A is a cross-sectional view showing an operation of an apparatus for manufacturing a display device according to an embodiment.
Figure 5B:
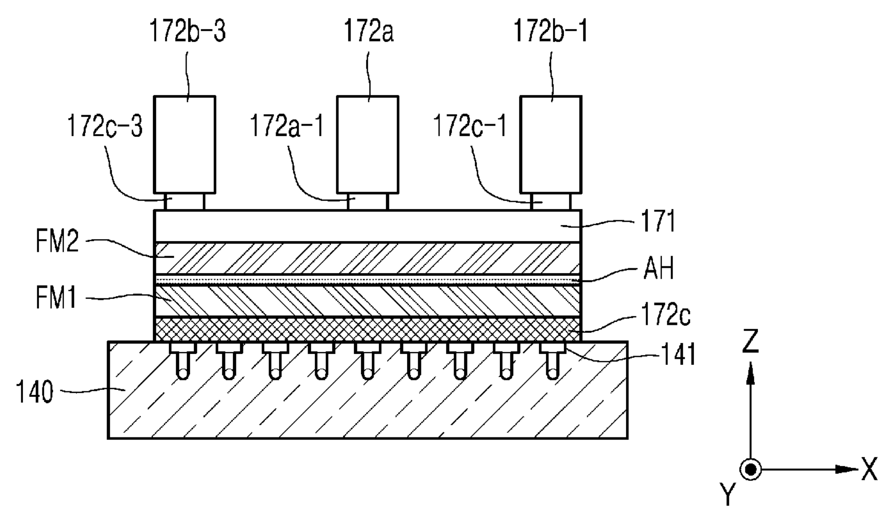
FIG. 5B is a cross-sectional view showing an operation of an apparatus for manufacturing a display device according to an embodiment.

FIG. 5A is a cross-sectional view for showing an operation of an apparatus for manufacturing a display device according to an embodiment. FIG. 5B is a cross-sectional view showing an operation of an apparatus for manufacturing a display device according to an embodiment.

Referring to FIGS. 5A and 5B, the pressurization portion 170 may include a detection unit 172_c_. In this state, the detection unit 172_c_ may include an electronic pressure sensitive paper. The electronic pressure sensitive paper may be in the form of a sheet of paper or a plate. In this state, the detection unit 172_c_ may be arranged between the stage 140 and one of the first member FM1 and the second member FM2, which is located below. In another embodiment, the detection unit 172_c_ may be arranged on the lower surface of the contact portion 171. In the following description, for convenience of explanation, a case in which the detection unit 172_c_ is arranged between the first member FM1 and the stage 140 is described.

The detection unit 172_c_ may measure a pressure applied to each part of the second member FM2 when the contact portion 171 presses the second member FM2. The measured pressure may be converted to a force or used, as it is, as a base of controlling each of the force application units.

For example, the operation of the first force application unit 172_a_ may be controlled based on the pressure applied by the first force application unit 172_a_. Furthermore, the operations of the second-1 force application unit 172_b_-1 and the second-3 force application unit 172_b_-3 may be detected based on the pressure applied by the second-1 force application unit 172_b_-1 and the second-3 force application unit 172_b_-3. In this state, the method of controlling each of the force application units based on the measured pressure is the same as or similar to the method of controlling each of the force application units by measuring the force described above, and, as such, a detailed description thereof is omitted.

Figure 6A:
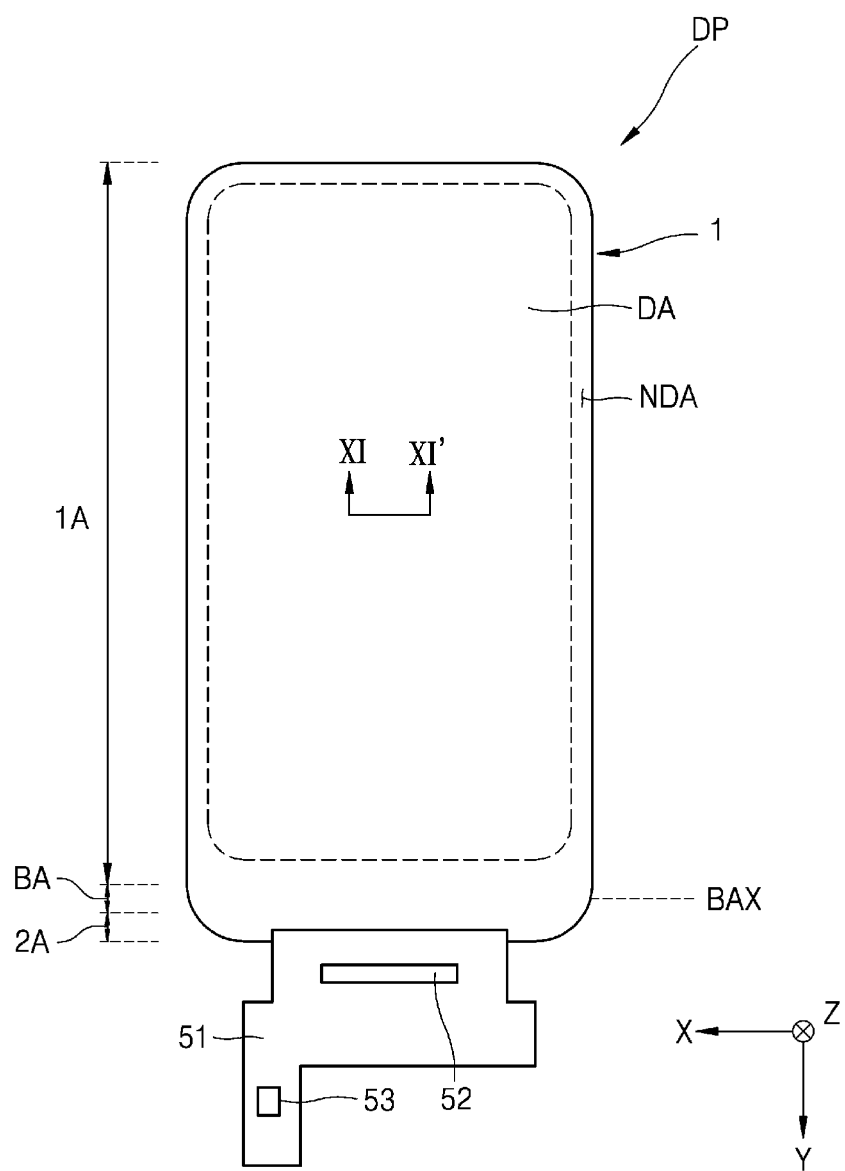
FIGS. 6A and 6B are plan views of a display device according to some embodiments.

FIG. 6A is a plan view of a display device DP according to an embodiment.

Referring to FIG. 6A, the display device DP may include the display panel 1, the display circuit board 51, a display driving portion 52, and a touch sensor driving portion 53. The display panel 1 may include a light-emitting display panel including a light-emitting element. For example, the display panel 1 may include an organic light-emitting display panel using an organic light-emitting diode including an organic light-emitting layer, a micro light-emitting diode display panel using a micro light-emitting diode (LED), a quantum-dot light-emitting display panel using a quantum-dot light-emitting diode including a quantum-dot light-emitting layer, or an inorganic light-emitting display panel using an inorganic light-emitting element including an inorganic semiconductor.

The display panel 1 may include a flexible display panel that is easily bendable, foldable, and/or rollable, but other deformations may be utilized in association with embodiments. For example, the display panel 1 may include a foldable display panel that can be folded or unfolded, a curved display panel having a curved display surface, a bended display panel in which an area other than a display surface is bent, a rollable display panel that can be rolled or unrolled, and a stretchable display panel that can be stretched, etc.

The display panel 1 may include a transparent display panel that is implemented to be transparent so that an object or background located on (or behind) the lower surface of the display panel 1 can be seen from the upper surface of the display panel 1. As another example, the display panel 1 may include a reflective display panel that can reflect an object or background of the upper surface of the display panel 1.

The display panel 1 may include a display area DA where an image is implemented and a peripheral area NDA arranged to surround the display area DA. A separate driving circuit, a pad, and the like may be arranged in the peripheral area NDA.

Furthermore, the display panel 1 may include a first area 1A arranged in the display area DA, a bending area BA that is bent with respect to a bending axis BAX, and a second area 2A that is connected to the bending area BA and to the display circuit board 51. In this case, the second area 2A and the bending area BA may be included in the peripheral area NDA, and no image may be implemented therein.

The display circuit board 51 may be attached on or near one side edge of the display panel 1. One side of the display circuit board 51 may be attached on the one side edge of the display panel 1 using an anisotropic conductive film.

The display driving portion 52 may be arranged on the display circuit board 51. The display driving portion 52 may receive control signals and power voltages, and generate and output signals and voltages for driving the display panel 1. The display driving portion 52 may be formed as an integrated circuit (IC).

The display circuit board 51 may be attached on the display panel 1. In this state, the display circuit board 51 and the display panel 1 may be attached to each other using an anisotropic conductive film. The display circuit board 51 may include a flexible printed circuit board (FPCB) that is bendable, or a composite printed circuit board including both of the FPCB and a rigid printed circuit board (RPCB) that is rigid and not easily bent.

The touch sensor driving portion 53 may be arranged on the display circuit board 51. The touch sensor driving portion 53 may be formed as an integrated circuit (IC). The touch sensor driving portion 53 may be attached on the display circuit board 51. The touch sensor driving portion 53 may be electrically connected to touch electrodes of a touchscreen layer of the display panel 1 via the display circuit board 51.

The touchscreen layer of the display panel 1 may sense a touch input of a user using at least one of various touch sensing methods, such as a resistive sensing method, a capacitive sensing method, an inductive sensing method, and/or the like. For example, when the touchscreen layer of the display panel 1 senses a user's touch input by a capacitive sensing method, the touch sensor driving portion 53 may apply driving signals to driving electrodes of the touch electrodes, sense voltages charged in mutual capacitances between the driving electrodes and the sense electrodes, through the sense electrodes of the touch electrodes, thereby determining whether there is a user's touch. The user's touch may include a contact touch and a proximity touch. The contact touch indicates that an object such as a user's finger, a pen, or the like directly contacts a cover member arranged on the touchscreen layer. The proximity touch indicates that, like hovering, an object, such as a user's finger, a pen, or the like, is located closely apart from the cover member. The touch sensor driving portion 53 may transmit sensor data to a main processor according to the sensed voltages, and calculate (or determine) touch coordinates where a touch input is generated as the main processor analyzes the sensor data.

Pixels of the display panel 1, a scan driving portion, and a power supply portion for supplying driving voltages to drive the display driving portion 52 may be additionally arranged on the display circuit board 51. As another example, the power supply portion may be integrated with the display driving portion 52, and in this case, the display driving portion 52 and the power supply portion may be formed as one IC.

Figure 6B:
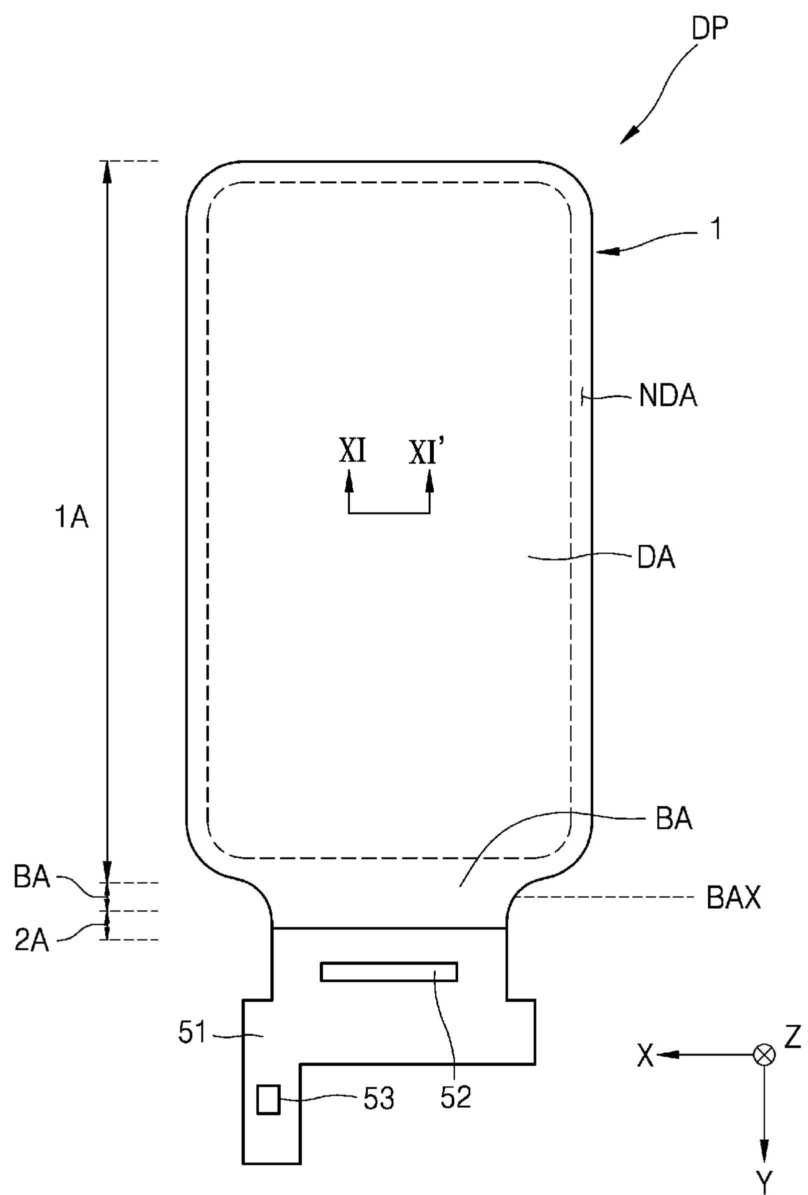

FIG. 6B is a plan view of a display device according to an embodiment.

Referring to FIG. 6B, the display device DP may include the display panel 1, the display circuit board 51, the display driving portion 52, and the touch sensor driving portion 53. In this state, the display panel 1, the display driving portion 52, and the touch sensor driving portion 53 may be similar to those described in association with FIG. 6A.

The display panel 1 may include the display area DA and the peripheral area NDA, the first area 1A in which the display area DA is arranged, the bending area BA that is bent, and the second area 2A connected to the bending area BA. In this state, the bending area BA that is connected to the first area 1A may be less than the length of one side of the first area 1A. For example, the width of the bending area BA measured in the X-axis direction of FIG. 6B may decrease from the first area 1A toward the second area 2A and then may be constant in a certain area.

The display circuit board 51 may be attached at or near one side edge of the display panel 1.

The display driving portion 52 may be arranged on the display circuit board 51. The display driving portion 52 may receive control signals and power voltages and generate and output signals and voltages to drive the display panel 1. The display driving portion 52 may be formed as an IC.

In another embodiment, the display driving portion 52 may be arranged on* (e.g., directly arranged on) a flexible film, and the display circuit board 51 and the display panel 1 may be connected to each other through an anisotropic conductive film. One side of the flexible film may be attached on one side edge of the display panel 1 using the anisotropic conductive film. The flexible film may be a flexible film that is bendable.

The display circuit board 51 may be attached to the other side of the display panel 1. The display circuit board 51 may include an FPCB that is bendable, or a composite printed circuit board including both of the FPCB and a rigid PCB that is rigid and not easily bent.

Figure 7:
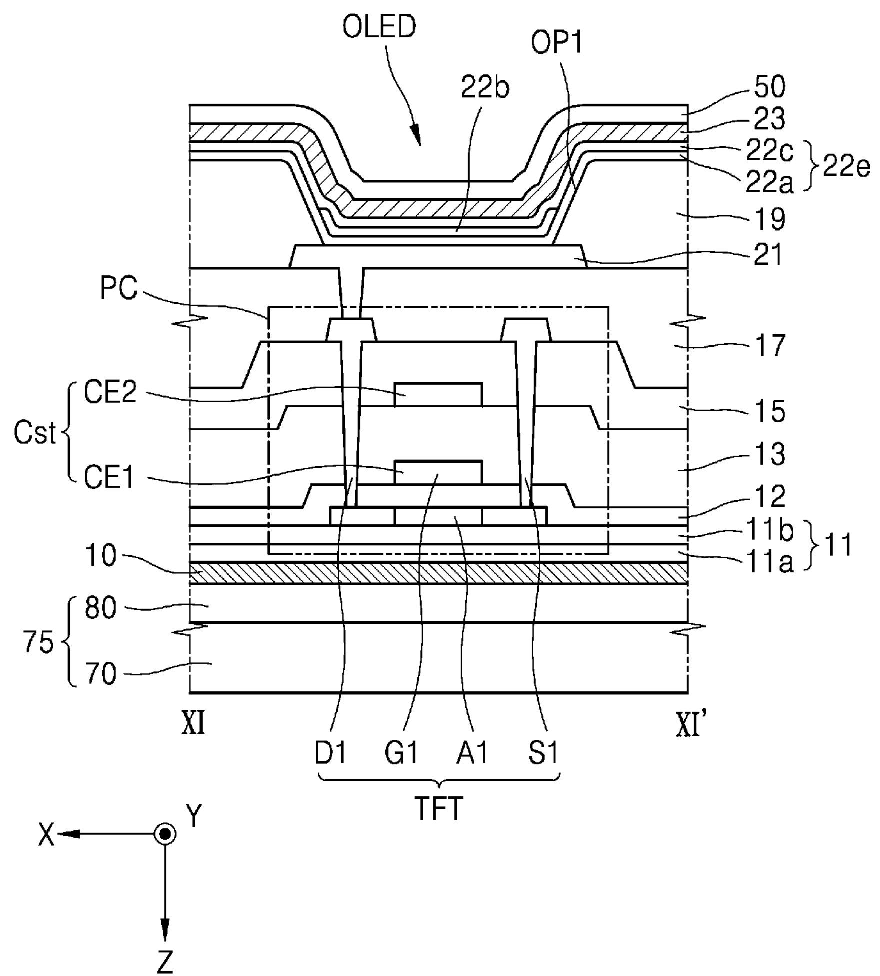
FIG. 7 is a cross-sectional view of a display panel taken along sectional line XI-XI' of FIG. 6A or 6B according to an embodiment.

FIG. 7 is a cross-sectional view of the display panel 1 taken along sectional line XI-XI' of FIG. 6A or 6B according to an embodiment.

Referring to FIG. 7, the display panel 1 may include a substrate 10, a buffer layer 11, a circuit layer, and a display element layer, which are stacked.

As described above, the substrate 10 may an insulating material, such as include glass, quartz, polymer resin, and/or the like. The substrate 10 may be a rigid substrate or a flexible substrate that is bendable, foldable, rollable, and/or the like.

A buffer layer 11 may be located on the substrate 10, reduce or block infiltration of a foreign material, moisture, and/or external air from under the substrate 10, and provide a planarized surface on the substrate 10. The buffer layer 11 may include an inorganic material, such as at least one of oxide or nitride, an organic material, and an organic/inorganic complex, and have a single layer or multilayer structure of an inorganic material and an organic material. A barrier layer for blocking infiltration of external air may be further provided between the substrate 10 and the buffer layer 11. In some embodiments, the buffer layer 11 may include a silicon oxide ($SiO_2$) or a silicon nitride ($SiN_X$). The buffer layer 11 may include a first buffer layer 11*a* and a second buffer layer 11*b*, which are stacked.

The circuit layer may be arranged on the buffer layer 11, and may include a pixel circuit PC, a first gate insulating layer 12, a second gate insulating layer 13, an interlayer insulating layer 15, and a planarization layer 17. The pixel circuit PC may include a thin film transistor TFT and a storage capacitor Cst.

The thin film transistor TFT may be arranged above the buffer layer 11. The thin film transistor TFT may include a first semiconductor layer A1, a first gate electrode G1, a first source electrode S1, and a first drain electrode D1. The thin film transistor TFT may be connected to an organic light-emitting diode OLED and may drive the organic light-emitting diode OLED.

The first semiconductor layer A1 may be arranged on the buffer layer 11 and may include poly silicon. In another embodiment, the first semiconductor layer A1 may include amorphous silicon. In another embodiment, the first semiconductor layer A1 may include oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first semiconductor layer A1 may include a channel region, and a source region and a drain region into which impurities are doped.

The first gate insulating layer 12 may be provided to cover the first semiconductor layer A1. The first gate insulating layer 12 may include an inorganic insulating material, such as at least one of $SiO_2$, $SiN_x$, a silicon oxynitride (SiON), an aluminum oxide ($Al_2O_3$), a titanium oxide ($TiO_2$), a tantalum oxide ($Ta_2O_5$), a hafnium oxide ($HfO_2$), a zinc oxide ($ZnO_x$), and the like. Here, the zinc oxide may be ZnO and/or $ZnO_2$. The first gate insulating layer 12 may be a single layer or multilayer including one or more of the above-described inorganic insulating materials.

The first gate electrode G1 is arranged above the first gate insulating layer 12 to overlap the first semiconductor layer A1. The first gate electrode G1 may include at least one of molybdenum (Mo), aluminum (Al), copper (Cu), Ti, and the like, and may be a single layer or multilayer. In an example, the first gate electrode G1 may be a single layer of Mo.

The second gate insulating layer 13 may be provided to cover the first gate electrode G1. The second gate insulating layer 13 may include an inorganic insulating material, such as at least one of $SiO_2$, $SiN_x$, SiON, $Al_2O_3$, $TiO_2$, $Ta_2O_5$, $HfO_2$, and $ZnO_x$. Here, the zinc oxide may be ZnO and/or $ZnO_2$. The second gate insulating layer 13 may be a single layer or multilayer including the above-described inorganic insulating material.

A first upper electrode CE2 of the storage capacitor Cst may be arranged above the second gate insulating layer 13.

In the display area DA, the first upper electrode CE2 may overlap the first gate electrode G1 thereunder. The first gate electrode G1 and the first upper electrode CE2, which overlap each other with the second gate insulating layer 13 therebetween, may constitute the storage capacitor Cst. The first gate electrode G1 may be a first lower electrode CE1 of the storage capacitor Cst.

The first upper electrode CE2 may include Al, platinum (Pt), palladium (Pd), silver (Ag), magnesium (Mg), gold (Au), nickel (Ni), neodymium (Nd), iridium (Ir), Cr, calcium (Ca), Mo, Ti, tungsten (W), and/or Cu, and may be a single layer or multilayer of the above-described material.

The interlayer insulating layer 15 may cover the first upper electrode CE2. The interlayer insulating layer 15 may include, for instance, at least one of $SiO_2$, $SiN_x$, SiON, $Al_2O_3$, $TiO_2$, $Ta_2O_5$, $HfO_2$, $ZnO_x$, and the like. Here, the zinc oxide may be ZnO and/or $ZnO_2$. The interlayer insulating layer 15 may be a single layer or multilayer including the above-described inorganic insulating material.

The first source electrode S1 and the first drain electrode D1 may be arranged on the interlayer insulating layer 15. The first source electrode S1 and the first drain electrode D1 may include a conductive material including, for example, at least one of Mo, Al, Cu, Ti, and the like, and may be a multilayer or single layer including the above materials. In an example, the first source electrode S1 and the first drain electrode D1 each may have a multilayer structure of Ti/Al/Ti.

The planarization layer 17 may be arranged to cover the first source electrode S1 and the first drain electrode D1. The planarization layer 17 may have a flat upper surface so that a pixel electrode 21 arranged thereon may be formed to be flat.

The planarization layer 17 may include an organic material or an inorganic material, and have a single layer structure or a multilayer structure. The planarization layer 17 may include a general purpose polymer, such as at least one of benzocyclobutene (BCB), polyimide, hexamethyldisiloxane (HMDSO), polymethylmethacrylate (PMMA), and polystyrene, a polymer derivative having a phenolic group, acrylic polymer, imide-based polymer, arylether-based polymer, amide-based polymer, fluorine-based polymer, p-xylene-based polymer, or vinyl alcohol-based polymer, and/or the like. The planarization layer 17 may include an inorganic insulating material, such as at least one of $SiO_2$, $SiN_x$, SiON, $Al_2O_3$, $TiO_2$, $Ta_2O_5$, $HfO_2$, or $ZnO_x$, and the like. Here, the zinc oxide may be ZnO and/or $ZnO_2$. When the planarization layer 17 is formed, to provide a flat upper surface after forming a layer, chemical mechanical polishing may be performed on an upper surface of the layer.

The planarization layer 17 may have a via hole for exposing any one of the first source electrode S1 and the first drain electrode D1 of the thin film transistor TFT, and the pixel electrode 21 may contact the first source electrode S1 or the first drain electrode D1, through the via hole, to be electrically connected to the thin film transistor TFT.

The pixel electrode 21 may include a conductive oxide, such as at least one of an indium tin oxide (ITO), an indium zinc oxide (IZO), a zinc oxide (ZnO), an indium oxide ($In_2O_3$), an indium gallium oxide (IGO), and an aluminum zinc oxide (AZO). The pixel electrode 21 may include a reflective film including, for instance, at least one of Ag, Mg, Al, Pt, Pd, Au, Ni, Nd, Ir, and Cr, or any compound thereof. For example, the pixel electrode 21 may have a structure including films including ITO, IZO, ZnO, or $In_2O_3$ above/below the above-described reflective film. In this case, the pixel electrode 21 may have a stack structure of, for example, ITO/Ag/ITO.

A pixel defining layer 19 may cover an edge of the pixel electrode 21 above the planarization layer 17, and may have a first opening OP1 that exposes a central portion of the pixel electrode 21. A light-emitting area of the organic light-emitting diode OLED, e.g., the size and shape of a subpixel, is defined by the first opening OP1.

The pixel defining layer 19 may increase a distance between the edge of the pixel electrode 21 and a counter electrode 23 above the pixel electrode 21 to prevent generation of arc and the like at the edge of the pixel electrode 21. The pixel defining layer 19 may include an organic insulating material, such as at least one of polyimide, polyamide, acryl resin, BCB, HMDSO, phenol resin, and the like, and may be formed by a method, such as spin coating and/or the like.

A light-emitting layer 22*b*, which is formed corresponding to the pixel electrode 21, is arranged in the first opening OP1 of the pixel defining layer 19. The light-emitting layer 22*b* may include a polymer material or a low molecular weight material, and emit red, green, blue, or white light, but embodiments are not limited thereto.

An organic functional layer 22*e* may be arranged above and/or below the light-emitting layer 22*b*. The organic functional layer 22*e* may include a first functional layer 22*a* and/or a second functional layer 22*c*. The first functional layer 22*a* or the second functional layer 22*c* may be omitted.

The first functional layer 22*a* may be arranged below the light-emitting layer 22*b*. The first functional layer 22*a* may be a single layer or multilayer of an organic material. The first functional layer 22*a* may be a hole transport layer (HTL) having a single layer structure. Alternatively, the first functional layer 22*a* may include a hole injection layer (HIL) and the HTL. The first functional layer 22*a* may be integrally formed to correspond to organic light-emitting diodes OLED included in the display area DA, which may be disposed in a portion of the peripheral area NDA.

The second functional layer 22*c* may be arranged above the light-emitting layer 22*b*. The second functional layer 22*c* may be a single layer or multilayer including an organic material. The second functional layer 22*c* may include an electron transport layer (ETL) and/or an electron injection layer (EIL). The second functional layer 22*c* may be integrally formed to correspond to organic light-emitting diode OLEDs included in the display area DA.

The counter electrode 23 is arranged above the second functional layer 22*c*. The counter electrode 23 may include a conductive material having a low work function. For example, the counter electrode 23 may include a (semi-) transparent layer including, for example, at least one of Ag, Mg, Al, Pt, Pd, Au, Ni, Nd, Ir, Cr, lithium (Li), Ca, an alloy thereof, and the like. Alternatively, the counter electrode 23 may further include a layer, such as at least one of ITO, IZO, ZnO, and $In_2O_3$ on the (semi-) transparent layer including the above-described material. The counter electrode 23 may be integrally formed to correspond to the organic light-emitting diodes OLEDs included in the display area DA.

Layers from the pixel electrode 21 to the counter electrode 23 formed in the display area DA may constitute the organic light-emitting diode OLED.

An upper layer 50 including an organic material may be formed on the counter electrode 23. The upper layer 50 may be provided to protect the counter electrode 23 and simultaneously increase light extraction efficiency. The upper layer 50 may include an organic material having a higher refractive index than the counter electrode 23. Alternatively, the upper layer 50 may include stack layers having different refractive indexes. For example, the upper layer 50 may include stack layers of a high refractive index layer/a low refractive index layer/a high refractive index layer. The refractive index of the high refractive index layer may be about 1.7 or more, and the refractive index of the low refractive index layer may be about 1.3 or less.

The upper layer 50 may additionally include LiF. Alternatively, the upper layer 50 may additionally include an inorganic insulating material, such as $SiO_2$ and/or $SiN_x$. The upper layer 50 may be omitted as necessary. However, in the following description, for convenience of explanation, a case in which the upper layer 50 is arranged on the counter electrode 23 is described.

In some embodiments, the display device DP may include a thin film encapsulation layer that shields the upper layer 50.

The thin film encapsulation layer may be arranged on the upper layer 50 to be in direct contact therewith. In this state, the thin film encapsulation layer may cover parts of the display area DA and the peripheral area NDA to prevent infiltration of external moisture and oxygen. The thin film encapsulation layer may include at least one organic encapsulation layer and at least one inorganic encapsulation layer. In the following description, for convenience of explanation, a case in which the thin film encapsulation layer includes a first inorganic encapsulation layer, an organic encapsulation layer, and a second inorganic encapsulation layer which are sequentially stacked on the upper surface of the upper layer 50 is described.

In the above case, the first inorganic encapsulation layer may cover the counter electrode 23, and include a silicon oxide, a silicon nitride, a silicon oxynitride, and/or the like. As the first inorganic encapsulation layer is formed along a structure thereunder, the upper surface of the first inorganic encapsulation layer upper surface may not be flat. The organic encapsulation layer may cover the first inorganic encapsulation layer, and unlike the first inorganic encapsulation layer, the upper surface of the organic encapsulation layer may be approximately flat. For instance, the upper surface of the organic encapsulation layer may be approximately flat in a portion corresponding to the display area DA. The organic encapsulation layer may include one or more materials selected from the group consisting of polyethylene terephthalate, polyethylene naphthalate, polycarbonate, polyimide, polyethylene sulfonate, polyoxymethylene, polyarylate, and HMDSO. The second inorganic encapsulation layer may cover the organic encapsulation layer, and include at least one of silicon oxide, a silicon nitride, a silicon oxynitride, and the like.

A touchscreen layer may be arranged on the thin film encapsulation layer.

Figure 8A:
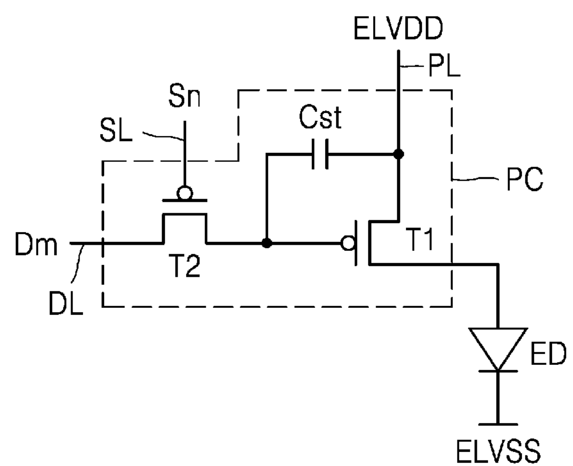
FIGS. 8A and 8B are circuit diagrams of the display device of FIG. 6A or 6B according to some embodiments.
Figure 8B:
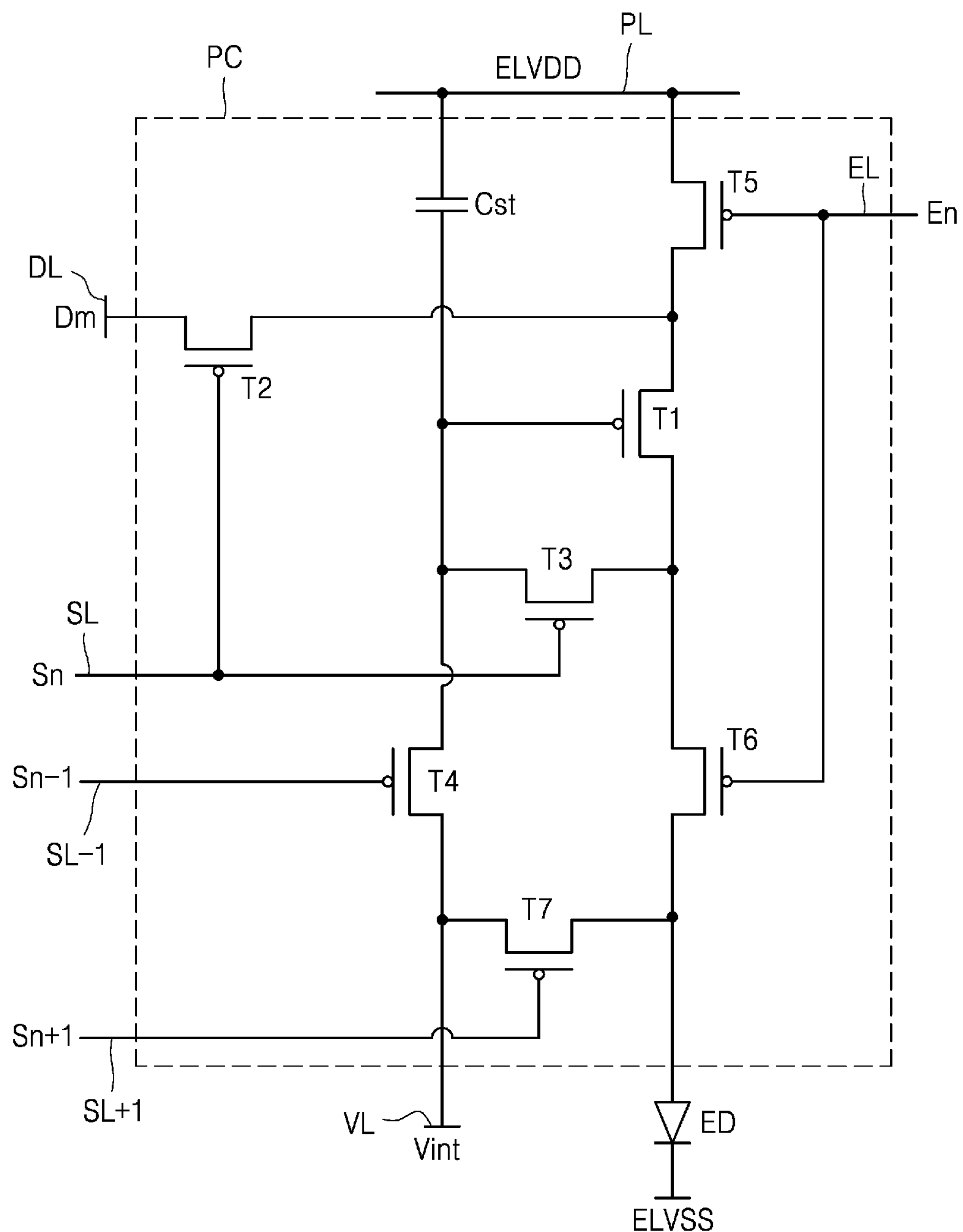

FIGS. 8A and 8B are circuit diagrams of the display device of FIG. 6A or 6B according to some embodiments.

Referring to FIGS. 8A and 8B, the pixel circuit PC may be connected to a light-emitting element ED, for example, the organic light-emitting diode OLED of FIG. 7, thereby implementing light emission of subpixels. The pixel circuit PC may include a driving thin film transistor T1, a switching thin film transistor T2, and the storage capacitor Cst. The switching thin film transistor T2 is connected to a scan line SL and a data line DL, and transmit a data signal Dm input through the data line DL to the driving thin film transistor T1, in response to a scan signal Sn input through the scan line SL.

The storage capacitor Cst is connected to the switching thin film transistor T2 and a driving voltage line PL, and stores a voltage equivalent to a difference between a voltage received from the switching thin film transistor T2 and a driving voltage ELVDD supplied to the driving voltage line PL.

The driving thin film transistor T1 is connected to the driving voltage line PL and the storage capacitor Cst, and may control a driving current flowing from the driving voltage line PL to the light-emitting element ED corresponding to a voltage value stored in the storage capacitor Cst. The light-emitting element ED may emit light having a certain luminance by the driving current.

Although FIG. 8A illustrates a case in which the pixel circuit PC includes two thin film transistors and one storage capacitor, the disclosure is not limited thereto.

Referring to FIG. 8B, the pixel circuit PC may include the driving thin film transistor T1, the switching thin film transistor T2, a compensation thin film transistor T3, a first initialization thin film transistor T4, an operation control thin film transistor T5, a light-emitting control thin film transistor T6, and a second initialization thin film transistor T7.

Although FIG. 8B illustrates a case in which signal lines SL, SL−1, SL+1, EL, and DL, an initialization voltage line VL, and the driving voltage line PL are provided for each pixel circuit PC, embodiments are not limited thereto. For instance, in another embodiment, at least any one of the signal lines SL, SL−1, SL+1, EL, and DL or/and the initialization voltage line VL may be shared by neighboring pixel circuits.

A drain electrode of the driving thin film transistor T1 may be electrically connected to the light-emitting element ED via the light-emitting control thin film transistor T6. The driving thin film transistor T1 receives the data signal Dm according to a switching operation of the switching thin film transistor T2 and supplies a driving current to the light-emitting element ED.

A gate electrode of the switching thin film transistor T2 is connected to the scan line SL, and a source electrode thereof is connected to the data line DL. A drain electrode of the switching thin film transistor T2 is connected to a source electrode of the driving thin film transistor T1 and may be connected to the driving voltage line PL via the operation control thin film transistor T5.

The switching thin film transistor T2 is turned on in response to the scan signal Sn received through the scan line SL and performs a switching operation of transmitting the data signal Dm transmitted through the data line DL to the source electrode of the driving thin film transistor T1.

A gate electrode of the compensation thin film transistor T3 may be connected to the scan line SL. A source electrode of the compensation thin film transistor T3 is connected to the drain electrode of the driving thin film transistor T1 and to a pixel electrode of the light-emitting element ED via the light-emitting control thin film transistor T6. A drain electrode of the compensation thin film transistor T3 may be connected to any one electrode of the storage capacitor Cst, a source electrode of the first initialization thin film transistor T4 and a gate electrode of the driving thin film transistor T1. The compensation thin film transistor T3 is turned on in response to the scan signal Sn received through the scan line SL, and connects the gate electrode of the driving thin film transistor T1 to the drain electrode thereof, thereby diode-connecting the driving thin film transistor T1.

A gate electrode of the first initialization thin film transistor T4 may be connected to a previous scan line SL−1. A drain electrode of the first initialization thin film transistor T4 may be connected to the initialization voltage line VL. The source electrode of the first initialization thin film transistor T4 may be connected to any one electrode of the storage capacitor Cst, the drain electrode of the compensation thin film transistor T3, and the gate electrode of the driving thin film transistor T1. The first initialization thin film transistor T4 is turned on in response to a previous scan signal Sn−1 received through the previous scan line SL−1, and may perform an initialization operation to initialize a voltage of the gate electrode of the driving thin film transistor T1 by transmitting an initialization voltage Vint to the gate electrode of the driving thin film transistor T1.

A gate electrode of the operation control thin film transistor T5 may be connected to a light-emitting control line EL. A source electrode of the operation control thin film transistor T5 may be connected to the driving voltage line PL. A drain electrode of the operation control thin film transistor T5 may be connected to the source electrode of the driving thin film transistor T1 and the drain electrode of the switching thin film transistor T2.

A gate electrode of the light-emitting control thin film transistor T6 may be connected to the light-emitting control line EL. A source electrode of the light-emitting control thin film transistor T6 may be connected to the drain electrode of the driving thin film transistor T1 and the source electrode of the compensation thin film transistor T3. A drain electrode of the light-emitting control thin film transistor T6 may be electrically connected to the pixel electrode of the light-emitting element ED. The operation control thin film transistor T5 and the light-emitting control thin film transistor T6 are simultaneously (or substantially simultaneously) turned on in response to a light-emitting control signal En received through the light-emitting control line EL, and transmit the driving voltage ELVDD to the light-emitting element ED, and thus the driving current flows in the light-emitting element ED.

A gate electrode of the second initialization thin film transistor T7 may be connected to a next scan line SL+1. A source electrode of the second initialization thin film transistor T7 may be connected to the pixel electrode of the light-emitting element ED. A drain electrode of the second initialization thin film transistor T7 may be connected to the initialization voltage line VL. The second initialization thin film transistor T7 is turned on in response to a next scan signal Sn+1 received through the next scan line SL+1, and may initialize the pixel electrode of the light-emitting element ED.

Although FIG. 8B illustrates a case in which the first initialization thin film transistor T4 and the second initialization thin film transistor T7 are respectively connected to the previous scan line SL−1 and the next scan line SL+1, embodiments are not limited thereto. For example, in another embodiment, the first initialization thin film transistor T4 and the second initialization thin film transistor T7 both are connected to a previous scan line SLn−1, and may be driven by the previous scan signal Sn−1.

The other electrode of the storage capacitor Cst may be connected to the driving voltage line PL. Any one electrode of the storage capacitor Cst may be connected to the gate electrode of the driving thin film transistor T1, the drain electrode of the compensation thin film transistor T3, and the source electrode of the first initialization thin film transistor T4.

A counter electrode, for example, the cathode, of the light-emitting element ED may receive a common voltage ELVSS. The light-emitting element ED may emit light by receiving the driving current from the driving thin film transistor T1.

The pixel circuit PC is not limited to the number and circuit design of the thin film transistor and the storage capacitor described with reference to FIGS. 8A and 8B, and the number and circuit design thereof may be variously changed.

Figure 9:
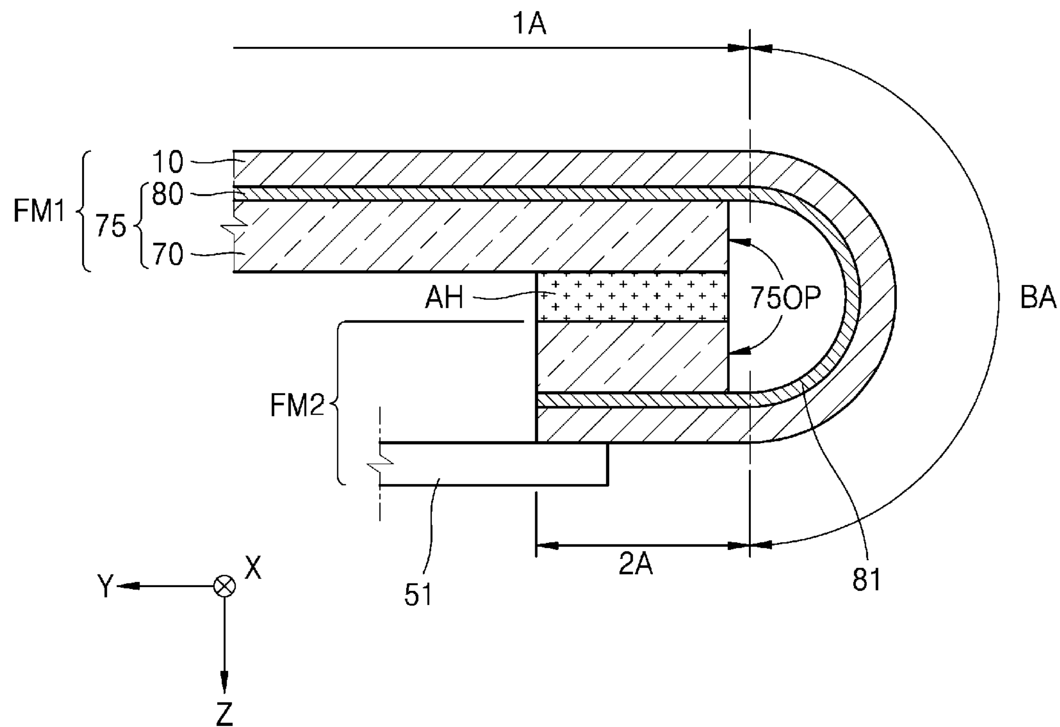
FIG. 9 is a cross-sectional view of the display device of FIG. 6A or 6B according to an embodiment.

FIG. 9 is a cross-sectional view of the display device of FIG. 6A or 6B according to an embodiment.

Referring to FIG. 9, when the display panel 1 is bent, the adhesive member AH may be arranged on the substrate 10 of the display panel 1. For instance, as the adhesive member AH is arranged in a portion where the substrate 10 is bent, one surface of the first area 1A of the display panel 1 and one surface of the second area 2A thereof are attached on the adhesive member AH and fixed thereon.

In another embodiment, a protection film 75 is arranged on the substrate 10, and the protection film 75 of the first area 1A and the protection film 75 of the second area 2A may be fixedly attached to each other through the adhesive member AH. In the following description, for convenience of explanation, a case in which the protection film 75 is arranged on the substrate 10 and the protection film 75 of the first area 1A and the protection film 75 of the second area 2A are attached on the adhesive member AH is described.

The protection film 75 may include a protection film base 70 and an adhesive layer 80. In this state, the protection film base 70 may include at least one of polyethylene terephthalate (PET) and polyimide (PI). Furthermore, the adhesive layer 80 may include various adhesive materials. In this state, the adhesive layer 80 may be arranged on the entire surface of the substrate 10, and the protection film base 70 may be arranged on the adhesive layer 80 and then partially removed to form an opening portion 75OP. In another embodiment, a part of the protection film base 70 and a part of the adhesive layer 80 may be removed to form the opening portion 75OP. In this state, both of the protection film base 70 and the adhesive layer 80 may not be present in the opening portion 75OP.

The substrate 10 may be bent in the bending area BA. As the protection film base 70 of the protection film 75 protects the lower surface of the substrate 10, the protection film base 70 may have stiffness. Accordingly, when the flexibility of the protection film base 70 is low, delamination may be generated between the protection film base 70 and the substrate 10 as the substrate 10 is bent. However, in the display device according to various embodiments, the protection film 75 having the opening portion 75OP corresponding to the bending area BA may effectively prevent (or at least mitigate) the generation of delamination.

As such, although the protection film 75 has the opening portion 75OP corresponding to the bending area BA and the protection film 75 is attached on the lower surface of the substrate in the first area 1A and the second area 2A, the disclosure is not limited thereto. For example, the protection film 75 may correspond to only at least a part of the first area 1A of the substrate 10. For instance, the protection film 75 may not be present in the second area 2A of the substrate 10.

Furthermore, according to one or more embodiments, the substrate 10 is bent around a bending axis such that a part of the lower surface of the first area 1A and a part of the lower surface of the second area 2A face each other, but embodiments are not limited thereto. For example, various modifications are possible such that the lower surface in the second area 2A does not face the lower surface in the first area 1A, and the like because a curvature in the bending area BA is small compared with that illustrated in the drawings, or the area of the bending area BA is small even when the curvature in the bending area BA has no much change.

In the above case, as described above, the substrate 10 may bend the display circuit board 51 in a state in which a tension is generated to the display circuit board 51.

In the above case, a part of the substrate 10 and a part of the protection film 75 may constitute the first member FM1, and the other part of the substrate 10 and the other part of the protection film 75, and the display circuit board 51 may constitute the second member FM2. In this case, on the stage 140 of FIG. 1, with respect to FIG. 9, one surface of the substrate 10 arranged in the first area 1A may be placed on the upper surface of the stage 140.

Figure 10:
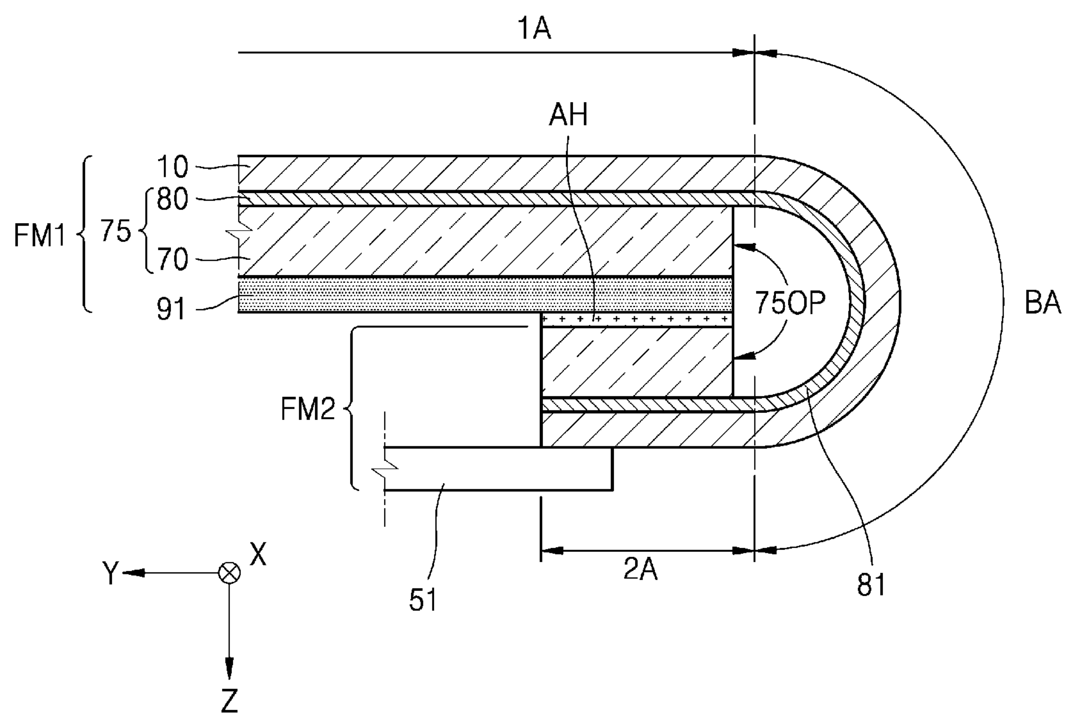
FIG. 10 is a cross-sectional view of the display device of FIG. 6A or 6B according to an embodiment.

FIG. 10 is a cross-sectional view of the display device of FIG. 6A or 6B according to an embodiment.

Referring to FIG. 10, after the substrate 10 and the like is bent, a cushion layer 91 may be further arranged in an area where the first area 1A and the second area 2A face each other. For example, the cushion layer 91 may be arranged in a portion of the first area 1A of the protection film base 70 and the second area 2A of the protection film base 70, in contact therewith. After the substrate 10 and the like is bent, the cushion layer 91 may be arranged in a space in which the first area 1A is separated apart from the second area 2A and may support the display panel 1 and absorb an impact. The cushion layer 91 may include an elastic material. In this state, the display device is not limited to the above, and the cushion layer 91 may be attached on the protection film base 70 before being bent.

In the above case, the adhesive member AH is arranged between the cushion layer 91 and the protection film base 70 of the second area 2A and fixes the cushion layer 91 and the protection film base 70.

In the above case, as described above, the substrate 10 may rotate and bend the display circuit board 51 in a state in which a tension is generated in the display circuit board 51.

In the above case, a part of the substrate 10, a part of the protection film 75, and the cushion layer 91 may constitute the first member FM1, and the other part of the substrate 10, the other part of the protection film 75, and the display circuit board 51 may constitute the second member FM2. In this case, on the stage 140 of FIG. 1, with respect to FIG. 9, one surface of the substrate 10 arranged in the first area 1A may be placed on the upper surface of the stage 140.

Figure 11:
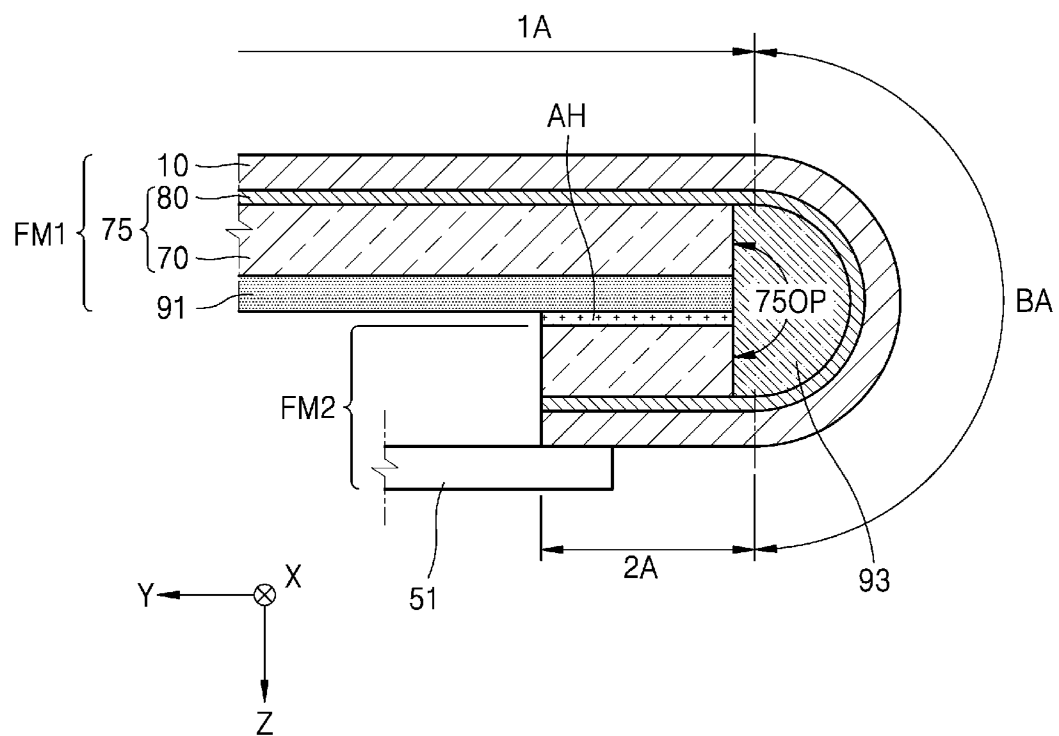
FIG. 11 is a cross-sectional view of the display device of FIG. 6A or 6B according to an embodiment.

FIG. 11 is a cross-sectional view of the display device of FIG. 6A or 6B according to an embodiment.

Referring to FIG. 11, the display device DP may further include a filling material 93 arranged in the opening portion 75OP. The filling material 93 may be used with the cushion layer 91. In this case, the filling material 93 and the cushion layer 91 may be arranged after bending. In another embodiment, the filling material 93 and the cushion layer 91 are arranged before bending, and then the substrate 10 may be bent. In this state, the disclosure is not limited to the above, and the filling material 93 and the cushion layer 91 may be arranged in various ways.

As described above, the adhesive member AH is arranged on the cushion layer 91, and thus, the cushion layer 91 may be fixed on the protection film base 70 of the second area 2A by the adhesive member AH.

In the above case, as described above, the substrate 10 may rotate and bend the display circuit board 51 in a state in which a tension is generated in the display circuit board 51.

In the above case, a part of the substrate 10, a part of the protection film 75 and cushion layer 91 may constitute the first member FM1, and the other part of the substrate 10, the other part of the protection film 75, and the display circuit board 51 may constitute the second member FM2. In this case, on the stage 140 of FIG. 1, with respect to FIG. 11, one surface of the substrate 10 arranged in the first area 1A may be placed on the upper surface of the stage 140.

Figure 12:
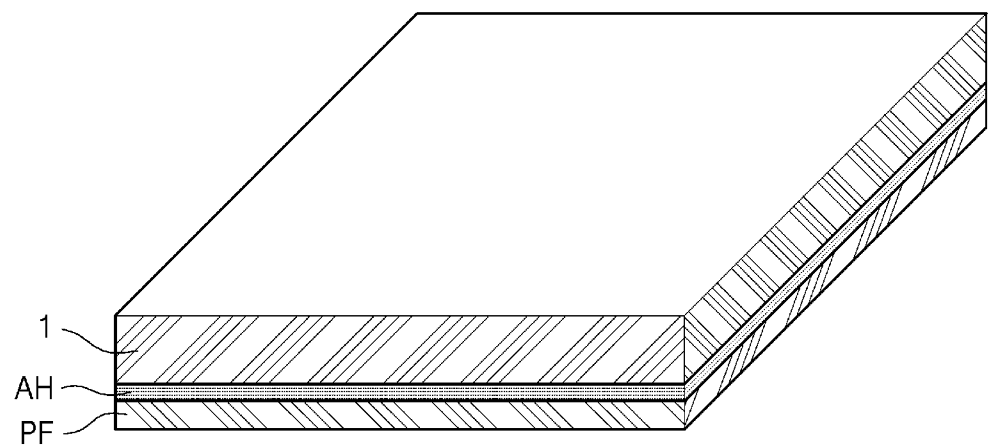
FIG. 12 is a perspective view of a display panel and a film member according to an embodiment.

FIG. 12 is a perspective view of the display panel 1 and a film member PF according to an embodiment.

Referring to FIG. 12, the film member PF may be attached on the display panel 1. In this state, the film member PF may be attached on the lower surface of the display panel 1. In this case, the film member PF may be arranged in a portion of the display panel 1 where a display area is not arranged, to protect the lower surface of the display panel 1. The adhesive member AH may be arranged between the film member PF and the display panel 1.

In the above case, on the stage 140 of FIG. 1, the film member PF may be arranged as the first member FM1, and the display panel 1 arranged on the film member PF may constitute the second member FM2 that the contact portion 171 contacts.

Figure 13:
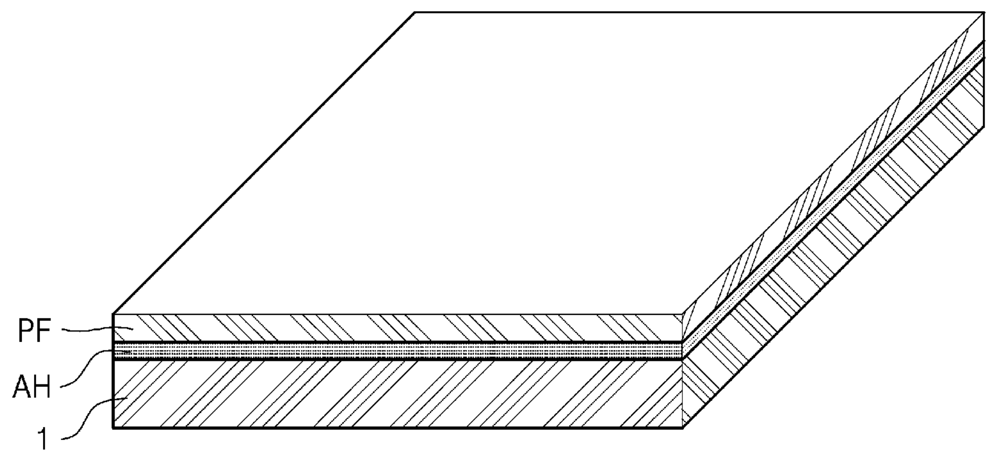
FIG. 13 is a perspective view of a display panel and a film member according to an embodiment.
Figure 13:
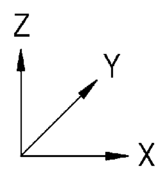

FIG. 13 is a perspective view of the display panel 1 and the film member PH according to an embodiment.

Referring to FIG. 13, the film member PF may be attached on the display panel 1. In this state, the film member PF may be attached on the upper surface of the display panel 1. In this case, the film member PF may be arranged on the upper surface of the display panel 1 where the display area is arranged, to protect the upper surface of the display panel 1. In another embodiment, the film member PF may include various members such as a polarized film, an optical functional layer, and the like. The adhesive member AH may be arranged between the film member PF and the display panel 1.

In the above case, on the stage 140 of FIG. 1, the display panel 1 may be arranged as the first member FM1, and the film member PF arranged on the display panel 1 may constitute the second member FM2 that the contact portion 171 contacts.

Figure 14:
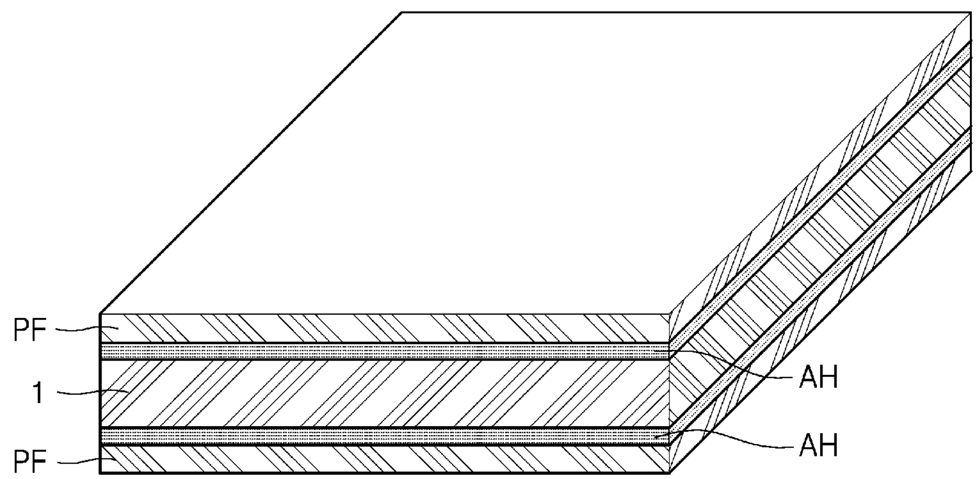
FIG. 14 is a perspective view of a display panel and a film member according to an embodiment.
Figure 14:
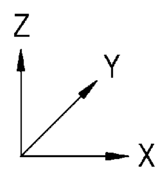

FIG. 14 is a perspective view of the display panel 1 and the film member PF according to an embodiment.

Referring to FIG. 14, the film member PF may be arranged and attached on both surfaces of the display panel 1. In this case, the film member PF arranged on the lower surface of the display panel 1 may be arranged on the stage 140 of FIG. 1. In this state, the adhesive member AH, the display panel 1, the adhesive member AH, and the film member PF are sequentially arranged above the film member PF, and may be attached to each other by pressurizing the same by the above-described method.

According to various embodiments, during attachment of a member, the member may be attached with a uniform force in the entire surface. According to various embodiments, irregularity of a force may be solved by sensing the same in real time. According to the various embodiments, different members may be attached to each other through precise compression.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A method of manufacturing a display device, the method comprising:

arranging a first member and a second member on a stage;

pressing one of the first member and the second member at at least two positions on one surface of one of the first member and the second member;

measuring forces applied to the at least two positions on the one surface of the one of the first member and the second member; and adjusting at least one of the forces applied to the at least two positions on the one surface of the one of the first member and the second member to be within a range of a predetermined force based on the forces applied to the at least two positions on the one surface of the one of the first member and the second member.

2. The method of claim 1, further comprising:

linearly moving the stage.

3. The method of claim 1, wherein:

the first member is a display panel; and the second member is a display circuit board.

4. The method of claim 1, wherein:

the first member is a part of a substrate of a display panel; and the second member is another part of the substrate of the display panel.

5. The method of claim 1, wherein one of the at least two positions corresponds to a center of one of the first member and the second member, and remaining ones of the at least two positions are symmetrical with respect to the one of the at least two positions.

6. The method of claim 1, further comprising:

arranging a detection unit for measuring the forces above or below one of the first member and the second member and only at locations that overlap each of the at least two positions in a thickness direction of the first member and the second member.

7. The method of claim 1, wherein the measuring occurs only at locations corresponding to each of the at least two positions.

8. A method of manufacturing a display device, the method comprising:

bending one of a first member onto a second member, or the second member;

arranging an adhesive between the first member and the second member;

arranging a combination of the first member and the second member onto a stage after the bending and after the arrangement of the adhesive;

pressing one of the first member and the second member onto another of the first member and the second member at at least two positions at locations that the first member and the second member overlap in a thickness direction of the second member; and adjusting forces applied to at least one of the at least two positions.

9. The method of claim 8, further comprising:

measuring forces applied to the at least two positions, wherein the adjusting forces is based on the measuring forces.

10. The method of claim 9, wherein the measuring forces occurs only at locations corresponding to each of the at least two positions.

* * * * *